(12) United States Patent
Becnel et al.

(10) Patent No.: US 11,411,532 B2
(45) Date of Patent: *Aug. 9, 2022

(54) METHODS AND SYSTEMS FOR POWER MANAGEMENT

(71) Applicant: Uplift Solar Corp., Las Vegas, NV (US)

(72) Inventors: Eric Dupont Becnel, Madison, AL (US); Jeffrey Darius Roberts, Las Vegas, NV (US)

(73) Assignee: UPLIFT SOLAR CORP., Las Vegas, NV (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/301,057

(22) Filed: Mar. 23, 2021

(65) Prior Publication Data
US 2021/0211092 A1 Jul. 8, 2021

Related U.S. Application Data

(63) Continuation-in-part of application No. 16/949,959, which is a continuation of application No.
(Continued)

(51) Int. Cl.
*H02M 3/158* (2006.01)
*H02S 40/30* (2014.01)
(Continued)

(52) U.S. Cl.
CPC ........ *H02S 40/30* (2014.12); *G01R 19/16538* (2013.01); *H01L 31/024* (2013.01);
(Continued)

(58) Field of Classification Search
None
See application file for complete search history.

(56) References Cited

U.S. PATENT DOCUMENTS

2004/0196018 A1 10/2004 Sutardja et al.
2006/0125539 A1 6/2006 Yoshikawa
(Continued)

OTHER PUBLICATIONS

International Search Report and Written Opinion dated Jun. 12, 2020 for PCT Patent Application No. PCT/US2020/023183.

*Primary Examiner* — Jeffery S Zweizig
(74) *Attorney, Agent, or Firm* — Womble Bond Dickinson (US) LLP; Joseph Bach, Esq.

(57) ABSTRACT

An apparatus comprises a plurality of power sources, one or more processors embedded with the plurality of power sources, and memory storing processor executable instructions that, when executed by the one or more processors, cause the apparatus to modify duty cycles of the power sources, and to modify timing for each phase of a multiphase cycle. In some cases, the apparatus: transfers, for each phase of the multiphase cycle, power from a different power source of a plurality of power sources to a load; determines, for each phase of the multiphase cycle, an input voltage associated with the transferred power, an output voltage associated with the transferred power, and current from the power source associated with the transferred power; determines a duty cycle associated with the power source; modifies duty cycles of the power sources; and modifies timing for each phase of the multiphase cycle.

42 Claims, 17 Drawing Sheets

Related U.S. Application Data

PCT/US2020/023183, filed on Mar. 7, 2020, now Pat. No. 11,081,962.

(60) Provisional application No. 62/819,710, filed on Mar. 18, 2019.

(51) Int. Cl.
*H01L 31/024* (2014.01)
*H03K 5/04* (2006.01)
*G01R 19/165* (2006.01)
*H03K 3/017* (2006.01)

(52) U.S. Cl.
CPC ............ *H02M 3/158* (2013.01); *H03K 3/017* (2013.01); *H03K 5/04* (2013.01)

(56) References Cited

U.S. PATENT DOCUMENTS

2010/0314947 A1 12/2010 Baarman et al.
2015/0207335 A1 7/2015 Madawala et al.

- 910: TRANSFER POWER FROM A DIFFERENT SOURCE FOR EACH PHASE OF A MULTI-PHASE CYCLE
- 920: DETERMINE AN INPUT VOLTAGE, AN OUTPUT VOLTAGE, AND CURRENT FROM THE SOURCE
- 930: DETERMINE A DUTY CYCLE ASSOCIATED WITH THE SOURCE
- 940: MODIFY THE DUTY CYCLE
- 950: MODIFY TIMING FOR EACH PHASE BASED ON THE MODIFIED DUTY CYCLE

METHODS AND SYSTEMS FOR POWER MANAGEMENT

CROSS REFERENCE TO RELATED PATENT APPLICATION

This application is a continuation-in-part of U.S. patent application Ser. No. 16/949,959, filed on Nov. 20, 2020; which is a continuation of PCT Application PCT/US2020/023183 filed Mar. 7, 2020; which claims priority to U.S. Provisional Application No. 62/819,710 filed Mar. 18, 2019; all of which are hereby incorporated by reference for all purposes.

BACKGROUND

Power conversion and routing methods employ power convertors (e.g., boost convertors, step-up convertors, switched mode power supplies, etc.) to increase power in electrical circuits. The duty cycles of solid-state devices, such as transistors, are controlled to operate as switches to control current flow within boost convertors. Intermittent current to the load from switched mode power supplies require extensive and expensive filtering techniques.

SUMMARY

Described are methods comprising transferring, for each phase of a multiphase cycle, power from a different source of a plurality of sources to a load, determining, for each phase of the multiphase cycle, an input voltage associated with the transferred power, an output voltage associated with the transferred power, and current from the source associated with the transferred power, determining a duty cycle associated with the source, modifying, based on the input voltage associated with the transferred power, the output voltage associated with the transferred power, the current from the source, the duty cycle associated with the source: wherein the modified duty cycle comprises an increase or a decrease in the duty cycle associated with the source based on one or more of the input voltage not satisfying an input voltage level threshold, the output voltage satisfying an output voltage level threshold, or the current from the source exceeding a current level threshold, and modifying, based on the modified duty cycle, timing for each phase of the multiphase cycle.

Also described are methods comprising determining, for each phase of a multiphase cycle, one or more parameter values associated with output power (e.g., power transferred to a load, etc.), modifying, based on the one or more parameter values, the duty cycle of a synchronization switching component associated with the phase, and causing, based on the modified duty cycle for each phase of the multiphase cycle, an equivalent transition time between each phase of the multiphase cycle.

Also described are methods comprising transferring, for each phase of a multiphase cycle, power from a different source of a plurality of sources to a load, determining, for each phase of the multiphase cycle, based on an input voltage associated with source and current drawn from the source, an amount of power transferred from the source to the load, and modifying, based on the amount of power transferred from the source to the load, current drawn from the source.

Additional advantages will be set forth in part in the description which follows or may be learned by practice. The advantages will be realized and attained by means of the elements and combinations particularly pointed out in the appended claims.

BRIEF DESCRIPTION OF THE DRAWINGS

The accompanying drawings, which are incorporated in and constitute a part of this specification, illustrate embodiments and together with the description, serve to explain the principles of the methods and systems for power management.

FIG. 9 is a flowchart of an example method for power management, in accordance with some embodiments.

DETAILED DESCRIPTION

Methods and systems for power management are described. The methods and systems described herein enable phase tuning of imbalanced power (energy) sources to improve power conversion efficiency. A control module and circuitry may be configured (e.g., embedded, etc.) with a power source(s), such as cells of a photovoltaic module (e.g., solar module, etc.) or multi-cell battery. The control module and circuitry may be used to transfer power (e.g., wattage) from the power source (e.g., components of the power source, etc.) to a load (e.g., a power inverter, an energy storage device, a heating element, a resistive load, an inductive load, a capacitive load, etc.) while minimizing output voltage transients (e.g., caused by intermittent current to the load from switched mode power supplies, etc.) by tuning the phase of discrete source components of the power source. For example, for a two-phase system the phases may have a 180 degree phase difference. The phase angle may be tuned based on the quantity of phases of the system (e.g., a three phase system, a four phase system, a polyphase system, etc.). The control module and circuitry may be used to manage switching (e.g., on/off, etc.) characteristics (e.g., duty cycle, etc.) of the connections of the power source(s) to produce optimal characteristics for power conversion, such as a reduced final output ripple or reduced output ripple before some final smoothing.

Figure 1:
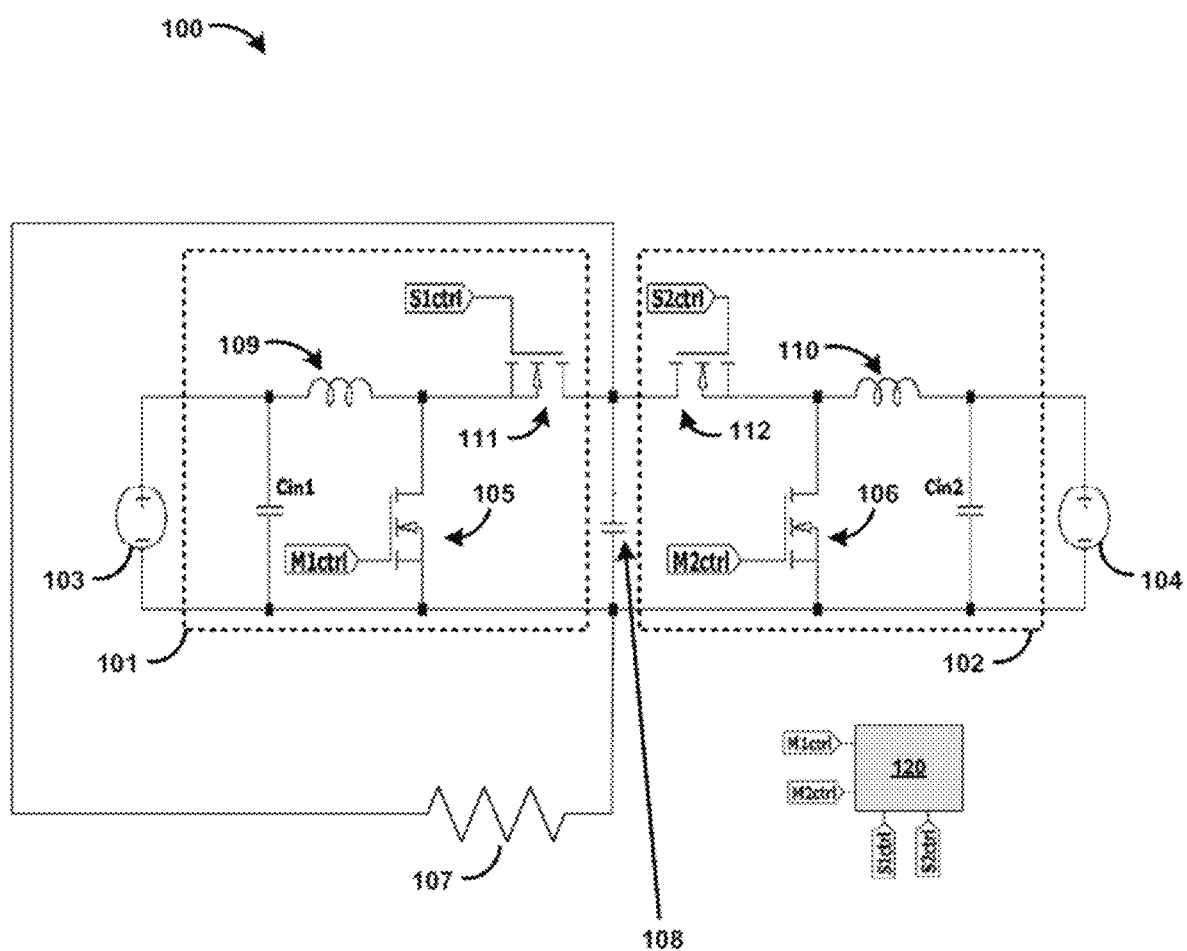
FIG. 1 is an example system for power management, in accordance with some embodiments.

FIG. 1 is a diagram of a system 100 for power management. The system 100 may utilize a multiphase control method that increases the voltage generated by power sources, such as photovoltaic cells of a solar module, one or more cells of a multi-cell battery/source, one or more energy harvesting devices (e.g., energy harvesting devices configured/embedded within an organic organism (e.g., jellyfish, etc.) and/or organic material (e.g., muscle tissue, etc.)). The system 100 may include a control module 120 that manages the timing of power delivery onset to an output so that the transients due to transitions of current outputs from interleaved power sources of the system 100 reduces the output filtering required while maximizing the power (e.g., wattage) accessed/sourced by a power source. The system 100 may include circuitry that steps up (e.g., increases, boost, etc.) voltage (while stepping down current) from a source when applied to a load. For example, the system 100 may include circuitry for a boost converter 101 and a boost converter 102. In some instances, the boost converter 101 and the boost converter 102 may be configured as an integrated circuit (IC) and/or the like. In some instances, the boost converter 101 and the boost converter 102 may be configured with discrete components, such as capacitors, resistors, inductors, power transistors, power transistor derivatives (e.g., bipolar junction transistors (BJTs), metal-oxide semiconductor field-effect transistors (MOSFETs), insulated gated bipolar transistors (IGBTs), thyristors, etc.). The boost converter 101 may step up (e.g., increases, boost, etc.) voltage (while stepping down current) from a source 103 and the boost converter 102 may step up (e.g., increases, boost, etc.) voltage (while stepping down current) from a source 104.

The source 103 and the source 104 may be any voltage source. For example, the source 103 and the source 104 may each be a photovoltaic cell of a photovoltaic cell-string (e.g., solar module, etc.), a cell of a multi-cell battery, or an energy-harvesting device (e.g., an energy-harvesting device associated with an organic organism, an energy-harvesting device associated with a thermoelectric device, etc.). In some instances, when voltage generated by the source 103 and the source 104 are at equal levels (e.g., the source 103 and the source 104 operating under the same conditions, etc.), the boost converter 101 and the boost converter 102 may operate 180 degrees out of phase with similar duty cycles. When voltage generated by the source 103 and the source 104 are at differing levels, the phase and duty cycle of the boost converter 101 and the boost converter 102 may be tuned to produce optimal performance (e.g., minimum voltage ripple, etc.) to a load 107 (e.g., an internal load, an external load, etc.). A voltage generated by a source (e.g., 103 and/or 104) is referred to as the "input voltage" in some cases. Load 107 can be any electrical load, such as a power inverter, an energy storage device, a heating element, a resistive load, an inductive load, a capacitive load. For example, a 180 degree phase shift (when measured at the center point of the off-state conduction) may be maintained for a 2 phase system to cause symmetric transitions between the phases and a reduction in output voltage ripple (e.g., the lowest possible output voltage ripple, etc.). In some instances, the system 100 may be scaled to any number of sources/phases. When each phase has different duty cycles the phase timing may be adjusted, for example, to cause equivalent transition periods between phases. Active duty cycle (and phase) management based on the performance of the sources (e.g., the source 103 and the source 104, etc.) enables the system 100 to require less output filtering, such as filtering by an output capacitor 108 (e.g., the capacitance value of capacitor 108 may be reduced, etc.). In some instances, the system 100 may not include the output capacitor 108 in parallel with the load 107. In instances when the system 100 does not include the output capacitor 108, fluctuations (e.g., spike, etc.) in power output by the system 100 may be fed to an external capacitor.

The phases of the boost converter 101 and the boost converter 102 may be controlled by a control module 120 (e.g., controller/driver module, multiphase controller, etc.). As described, in some instances, the system 100 may be scaled. For example, the system 100 may be scaled to include any number of sources, respective boost converters associated with the sources, and any number of respective phases control controlled by the control module 120. For example, the system 100 may be a two-phase system (as shown), a three-phase system, a four-phase system, or an n-th phase system (where n denotes any numeric value greater than 1). The control module 120 may include a processor, a logic chip, a microcontroller (MCU), a central processing unit (CPU), a field programmable gate array (FPGA), an application-specific integrated circuit (ASIC), and/or the like. In some instances, the control module 120 and/or the boost converter 101 and the boost converter 102 may be embedded (configured) with the sources (e.g., the source 103, the source 104, etc.) and the output capacitor 108. For example, the control module 120 and/or the boost converter 101 and the boost converter 102 may be embedded (configured) within a solar module that includes multiple photovoltaic submodules. The control module 120 may control power transferred to a load 107 from the source 103 and the source 104. The load 107 may be any component that consumes power.

In some instances, the current (and/or voltage polarity) for the system 100 may be reversed, causing current from the load 107 to be routed through a source (e.g., the source 103, the source 104, etc.), and/or causing power from load 107 to be transferred to a source. The increased (high) voltage at the load 107 relative to the source allows current to reverse direction, if desired, and to be consumed by the source (e.g., the source 103, the source 104, etc.). For example, the current of the system 100 may be reversed to cause one or more photovoltaic cells of solar module to generate heat (e.g., heat up, light up, etc.). In another example, the current of the system 100 may be routed through (and power transferred to) embedded resistive heating elements to heat one or more portions of a battery, for example, to improve the efficiency of the battery by increasing the temperature of the portion(s). In some instances, the current of the system 100 may be reversed, for example, by the control module 120 causing a turn on of a sync switch (e.g., a synchronization transistor, an n-type MOSFET, sync switch 111, sync switch 112, etc.) to activate, turn on (e.g., transition from an off-state to an on-state, etc.), and/or the like at a time period when a boost convertor (e.g., the boost converter 101, the boost converter 102, etc.) is operating below a load voltage. Turning on a sync switch when a boost convertor operating below its load voltage may cause current to flow from a load through an associated inductor (e.g., an inductor 109, an inductor 110, etc.). By modifying the duty cycles and/or voltage on a main switch, the control module 120 may actively control the rate at which the solar module heats up. As another example, the current of the system 100 may be reversed to induce current in neurons and/or muscle fibers, induce varying charge levels in cells of a multi-cell battery, control one or more electrostimulation device (e.g., associated with organic material, etc.) and/or the like.

The control module 120 may actively modify/change (e.g., tune, etc.) the duty cycle of a main switch 105 associated with the boost converter 101 and a main switch 106 associated with the boost converter 102. The main switch 105 and the main switch 106 may be transistors (e.g., n-type MOSFETs, etc.) or any other switching component and/or semiconductor. The control module may actively modify/change (e.g., tune, etc.) the duty cycle of the main switch 105 and the main switch 106 of each phase in order to control the power transferred from the source 103 and the source 104, respectively, for each phase. For example, M1ctrl and M2ctrl indicate the electrical connections between the main switch 105 and the main switch 106, respectively, with the controller 120.

The control module 120 may modify/change (e.g., tune, etc.) the active duration (e.g., duty cycle) of the main switch 105 and the main switch 106. The controller 120, by activating M1ctrl and M2ctrl, may cyclically cause the main switch 105 and the main switch 106 to conduct electricity (e.g., activate, turn on, etc.). When the main switch 105 is "on," (e.g., conducting electricity, etc.), the source 103 may sink current in series through an inductor 109 and the main switch 105, then back to the source 103 (via a short circuit) causing the inductor 109 to generate a magnetic field. When the main switch 105 is switched "off" (e.g., not conducting electricity, etc.), the impedance through the main switch 105 may increase and cause the voltage across the inductor 109 to increase. When the main switch 105 is switched "off" (e.g., not conducting electricity, etc.), the control module 120 may cause, by activating S1ctrl (via a digital control signal, etc.), a sync switch 111 (e.g., a synchronization transistor, an n-type MOSFET, etc.) to activate, turn on (e.g., transition from an off-state to an on-state, etc.), and/or the like. When the sync switch 111 is active, the increased voltage across the inductor 109 may be conducted to the load 107 and the capacitor 108 (e.g., an output capacitor), causing the magnetic field produced by the inductor 109 to be reduced. During a different phase, when the main switch 106 is "on," (e.g., conducting electricity, etc.), the source 104 may sink current in series through an inductor 110 and the main switch 106, then back to the source 104 (via a short circuit) causing the inductor 110 to generate a magnetic field. When the main switch 106 is switched "off" (e.g., not conducting electricity, etc.), the impedance through the main switch 106 may increase and cause the voltage across the inductor 110 to increase. When the main switch 106 is switched "off" (e.g., not conducting electricity, etc.), the control module 120 may cause, by activating S2ctrl, a sync switch 112 (e.g., a synchronization transistor, an n-type MOSFET, etc.) to activate, turn on (e.g., transition from an off-state to an on-state, etc.), and/or the like. When the sync switch 112 is active, the increased voltage across the inductor 110 may be conducted to the load 107 and the capacitor 108, causing the magnetic field produced by the inductor 110 to be reduced. The control module 120 may modify/change (e.g., tune, etc.) the active duration (e.g., duty cycle) of the sync switch 111 and the sync switch 112 to avoid overvoltage output conditions.

The control module 120 may be configured with control logic for managing activation (e.g., duty cycles, etc.) of the main switch 105, the main switch 106, the sync switch 111, and the sync switch 112 in response to conditions affecting the source 103 and/or the source 104 to optimize power transferred to the load 107. For example, when voltage associated with the source 103 and/or the source 104 is reduced, the control module 120 may increase the duty cycles of the main switch 105 and/or the main switch 106, respectively, to enable more time for the strength of the magnetic fields of the inductor 109 and the inductor 110, respectively, to increase to a level that produces a target/ideal output voltage across the load 107. As another example, when current from the source 103 and/or the source 104 is reduced, the control module 120 may decrease the duty cycles of the main switch 105 and/or the main switch 106, respectively, to maintain a peak power point by causing less (on average) current to be drawn across the inductor 109 and the inductor 110, respectively, to produce a target/ideal output voltage across the load 107. Additionally, the control module 120 may modify/change the duty cycles of the sync switch 111 and the sync switch 112, respectively, based on a relationship between the voltage associated with the source 103 and/or the source 104, and the output voltage (e.g., the voltage across the load 107).

Assuming ideal conditions, the control module 120 may modify/change the duty cycles of the main switch 105, the main switch 106, the sync switch 111, and the sync switch 112, respectively, based on the following equations:

$$\text{Duty Cycle}_{main\ switch\ 105} = \frac{V_{out} - V_{source\ 103}}{V_{out}} \quad (1)$$

$$\text{Duty Cycle}_{main\ switch\ 106} = \frac{V_{out} - V_{source\ 104}}{V_{out}} \quad (2)$$

$$\text{Duty Cycle}_{sync\ switch\ 111} = \frac{V_{source\ 103}}{V_{out}} \quad (3)$$

$$\text{Duty Cycle}_{sync\ switch\ 112} = \frac{V_{source\ 104}}{V_{out}}, \quad (4)$$

where $V_{out}$ is the voltage across the load 107. In some instances, the equations described may deviate based on one or more real world occurrences, such as in situations of inducing overvoltage output conditions and/or the like. In some cases, the control module 120 may modify/change the duty cycles of any switch (transistor) of the system 100 (e.g., the main switch 105, the main switch 106, the sync switch 111, the sync switch 112, etc.) based on any relationships between the output voltage (e.g., $V_{out}$) and voltage and/or current associated with a source that optimizes the output voltage.

In some instances, such as when controlling a two phase system, the control module 120 may control timing for phases (e.g., signals, pulses, pulse trains, etc.) of the system 100 such that each phase is sequenced so that the center of the on-state (e.g., the active/conducting duration of the duty cycle) duration for the respective synchronization switch (e.g., the sync switch 111, the sync switch 112, etc.) has a phase angle of 180 degree relative to the next phase. The control module 120 may control timing for phases of any multiphase system with interleaved sources so that the timing/duration between phases is equivalent. For a multiphase system, the control module 120 may cause the centers of the "on" states for synchronization switches to be aligned to cause the sum of the phases to be evenly distributed when the control module 120 modifies/changes the respective duty cycle. As such, under ideal conditions, the voltage ripple ($V_{outRipple}$) across the output capacitor 108 may be determined by the following equation:

$$V_{outRipple} = \frac{I_{out}}{C_{capacitor108}} \left| \frac{V_{out} - V_{sources}}{V_{out}} \right| \frac{1}{\text{Frequency} * n_{phase}},$$

where $n_{phase}$ represents the number of sources/phases (e.g., the source 103, the source 104, etc.) for the system 100, and $V_{sources}$ represents the total voltage of the sources/phases. Based on the desired output of the system 100 (e.g., a given set of output requirements that specify current level, voltage level, etc.), an equivalent time distribution in current flowing to the capacitor 108 provides a lowest possible current ripple. The low current ripple may cause the system 100 to require less filtering than traditional power management systems, such as single phase systems. The reduced filtering requirements of the system 100 renders the system 100 cost effective (e.g., fewer components, reduced component values, etc.) and functionally versatile (e.g., reduced size, reduced heat, embeddable assembly, etc.) in comparison to traditional power management systems.

Figure 2:
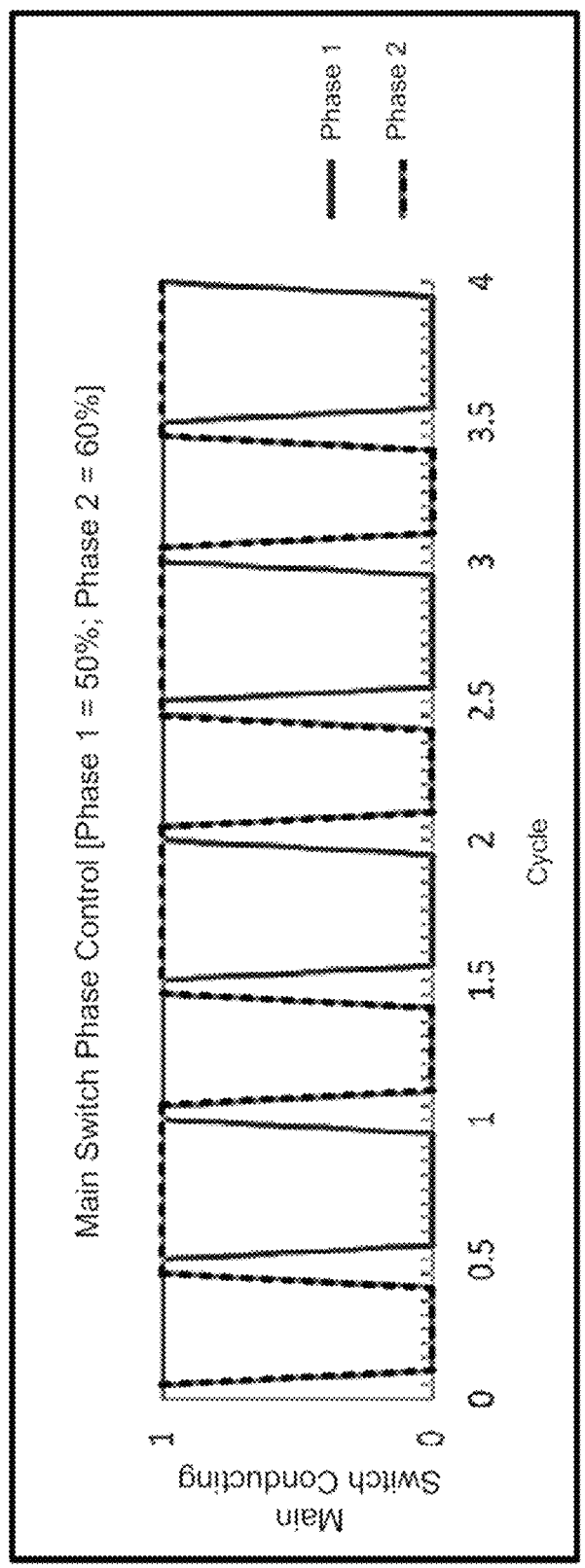
FIG. 2 is a diagram for power management, in accordance with some embodiments.
Figure 3:
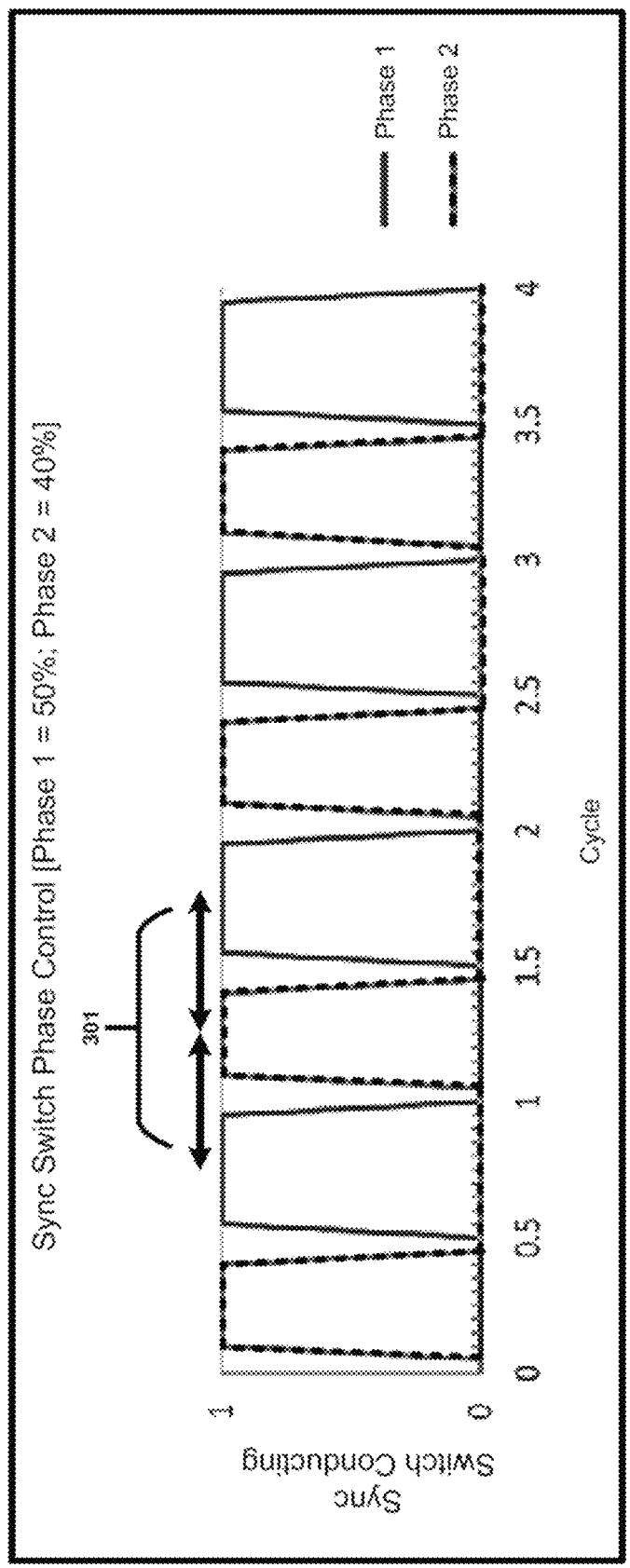
FIG. 3 is a diagram for power management, in accordance with some embodiments.
Figure 4:
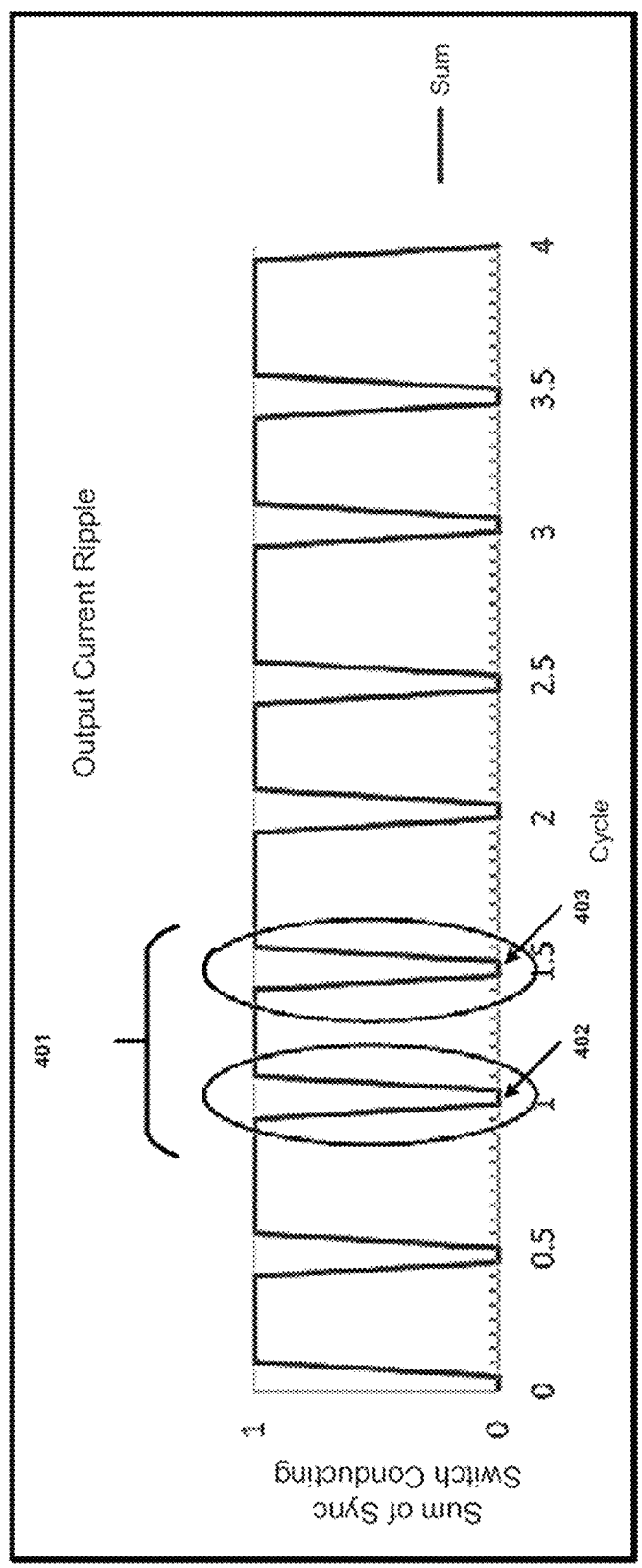
FIG. 4 is a diagram for power management, in accordance with some embodiments.

FIGS. 2-4 are timing diagrams of the system 100 (configured as a two-phase system). FIG. 2 is a timing diagram illustrating the phase control of the system 100 (configured as a two-phase system) where the control module 120 causes a duty cycle of the main switch 105 to have a duty cycle of fifty percent (50%) and the main switch 106 to have a duty cycle of sixty percent (60%). FIG. 3 is a timing diagram illustrating the phase control of the system 100 (configured as a two-phase system) where the control module 120 causes a duty cycle of the sync switch 111 to have a duty cycle of fifty percent (50%) and the sync switch 112 to have a duty cycle of forty percent (40%) for the entire duration of each phase that the main switch 105 or the main switch 106 is disabled, respectively. As illustrated at 301, there is a fifty percent (50%) phase delay between the centers of the conduction cycles. FIG. 4 is a timing diagram of the output current ripple of the system 100 (configured as a two-phase system). The sum of the "on" time (e.g., the active/conducting duration of the duty cycle) for the sync switch 111 and the sync switch 112 is ninety percent (90%), implying a down ("off") time of ten percent (10%). As shown 401, the 10% down ("off") time is evenly distributed into two 5% down ("off") times (e.g., 402, 403, etc.) between the phases.

Figure 5:
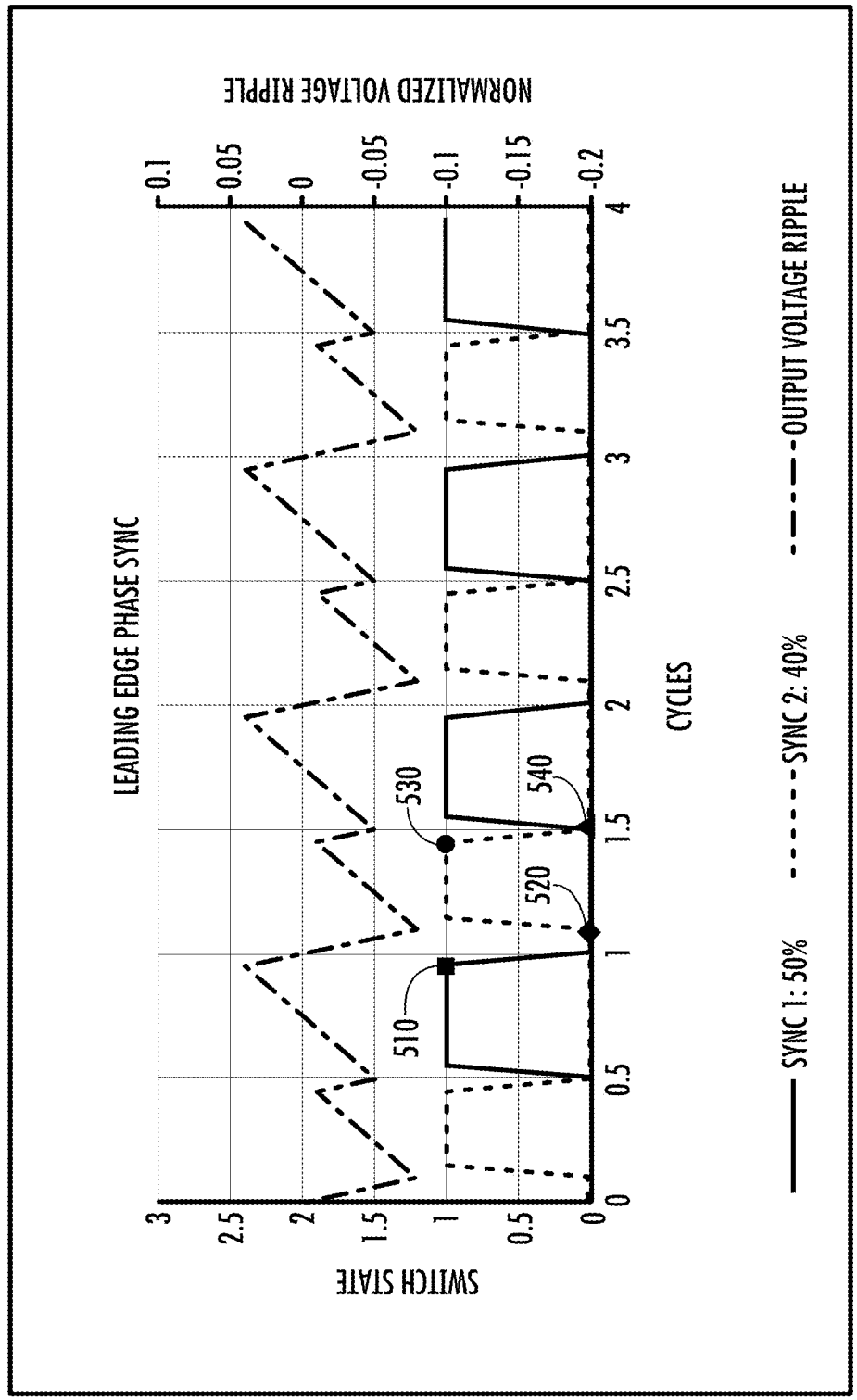
FIG. 5 is a diagram for power management, in accordance with some embodiments.

FIG. 5 plots the phases of the sync switches in relation to the output voltage ripple of a two phase system with boost converters connected to independent sources and the leading edges (as opposed to the center) of the respective signals are managed by the control module 120 for phase control. The sum of the "on" time (e.g., the active/conducting duration of the duty cycle) for the sync switches is ninety percent (90%). As shown in FIG. 5, the normalized voltage ripple of the two phase system independent source system is 0.12. The normalized voltage ripple of 0.12 is caused by a larger phase gap following the current delivery by the sync switch.

FIG. 5 further includes points 510, 520, 530 and 540. Point 510 indicates the point at which a first phase of the two-phase cycle is turned off. Point 520 indicates the point at which a second phase of the two-phase cycle is turned on. A time between the moments when a phase of a multiphase cycle is turned off and a next phase of a multiphase cycle is turned on (e.g., the time between points 510 and 520) is referred to as a "transition time" between the phases. Similarly, point 530 indicates the point at which the second phase of the two-phase cycle is turned off, and point 540 indicates the point at which the first phase of the two-phase cycle is turned on. Since the time between points 510 and 520 and the time between points 530 and 540 are different from one another, this two-phase system has two different transition times. As shown in FIG. 5, during the transition times the normalized voltage ripple has a negative slope, and at times when at least one of the phases is on (i.e., has a switch state of 1) the slope of the normalized voltage ripple is positive.

Figure 6:
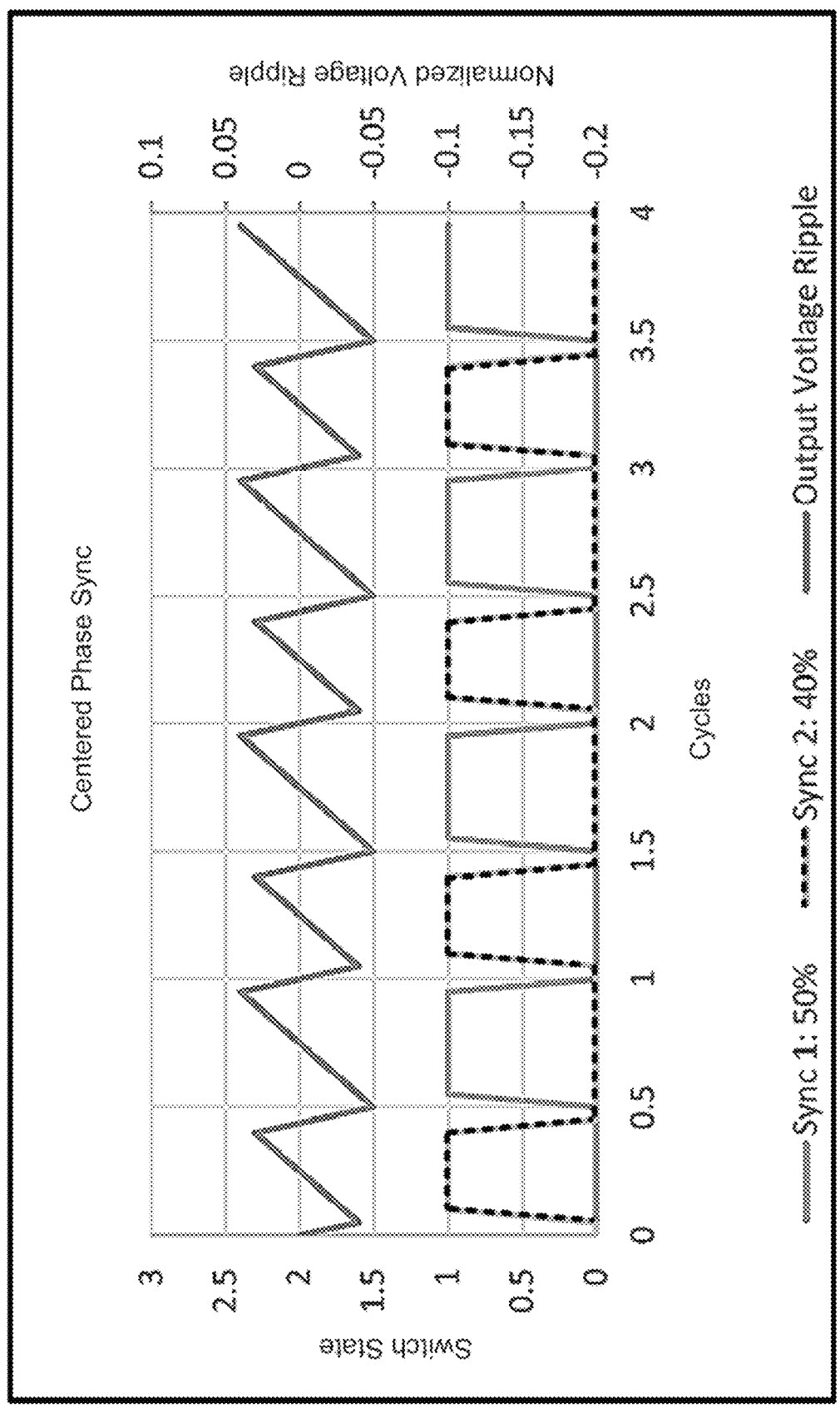
FIG. 6 is a diagram for power management, in accordance with some embodiments.

FIG. 6 plots the phases of the sync switches (e.g., the sync switch 111, the sync switch 112) in relation to the output voltage ripple, when the center phases of the respective signals are managed by the control module 120 for phase control of the system 100. For example, the control module 120 may cause the sum of the "on" time (e.g., the active/conducting duration of the duty cycle) for the sync switch 111 and the sync switch 112 to be ninety percent (90%). As shown in FIG. 6, the normalized voltage ripple of the system 100 is 0.09. The normalized voltage ripple of 0.09 is caused by a balance of the phase gaps following the current delivery (to the load 107) by the sync switch 111 and the sync switch 112. FIG. 6 illustrates that when the control module 120 causes a sync switch (e.g., the sync switch 111 and the sync switch 112) to conduct, current transferred to the load causes a voltage increase. When the control module 120 causes a sync switch (e.g., the sync switch 111 and the sync switch 112) to stop conducting, there is a sharp decrease in voltage as the capacitor 108 sustains the current to the load 107. FIG. 6 illustrates that when the control module 120 causes equivalent transition times between phases, peak electrical transients are minimized (see FIG. 5 for comparison).

Figure 7:
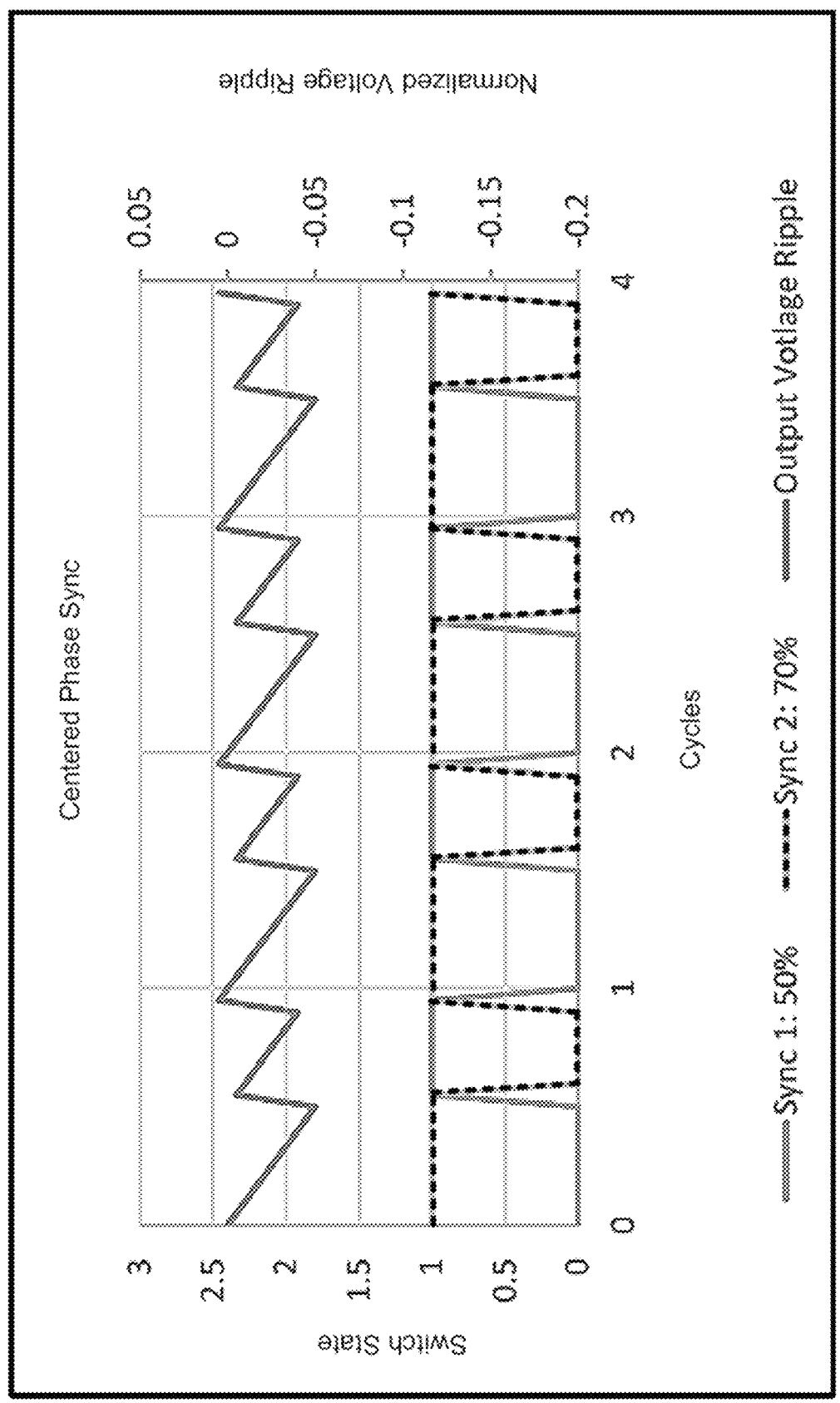
FIG. 7 is a diagram for power management, in accordance with some embodiments.

FIG. 7 plots the phases of the sync switches (e.g., the sync switch 111, the sync switch 112) in relation to the output voltage ripple (based on the center of the phases of the respective signals) when the control module 120 causes the sync switches (e.g., the sync switch 111, the sync switch 112) to deliver current to the output of the system 100 at the same time. In this case, the transition times between the phases are negative because the next phase of the cycle is turned on before the previous phase is turned off. Any surplus current may cause a sharp increase in voltage at the output of the system 100. The sharp increase in voltage may be followed by a gradual reduction in the output voltage whenever the load current is not sustained for a single phase of the system 100. Notably FIG. 7 illustrates inverse system behavior in relation to the previous description (e.g., system behavior depicted in FIG. 6).

As described, the control module 120 may modify timing for each phase of the multiphase cycle of the system 100. For example, the control module 120 may modify the timing for each phase of the multiphase cycle by delaying, based on the conductive state of the respective source to the load, each phase of the multiphase cycle so that each of the transition times between each of the phases of the multiphase cycle are equivalent. However, in some instances, the control module 120 modifies timing for phases of the multiphase cycle of the system 100 so that the load is "off" (e.g., a non-active/non-conducting, etc.) for a portion of a phase or multiple phases (e.g., phase pulse skipping, etc.) causing current (or power, or energy) collected while the load is "off" to be distributed/delivered to the load during the "on" time (e.g., the active/conducting duration) for a phase. For example, the system 100 may be used to provide power to an electromechanical device that requires a period of recharge after transferring energy to (e.g., stimulating, etc.) muscle fibers. The control module 120 may modify timing for each phase of the multiphase cycle of the system 100 based on the parameters of a load and/or a desired power output by the system 100.

Figure 8:
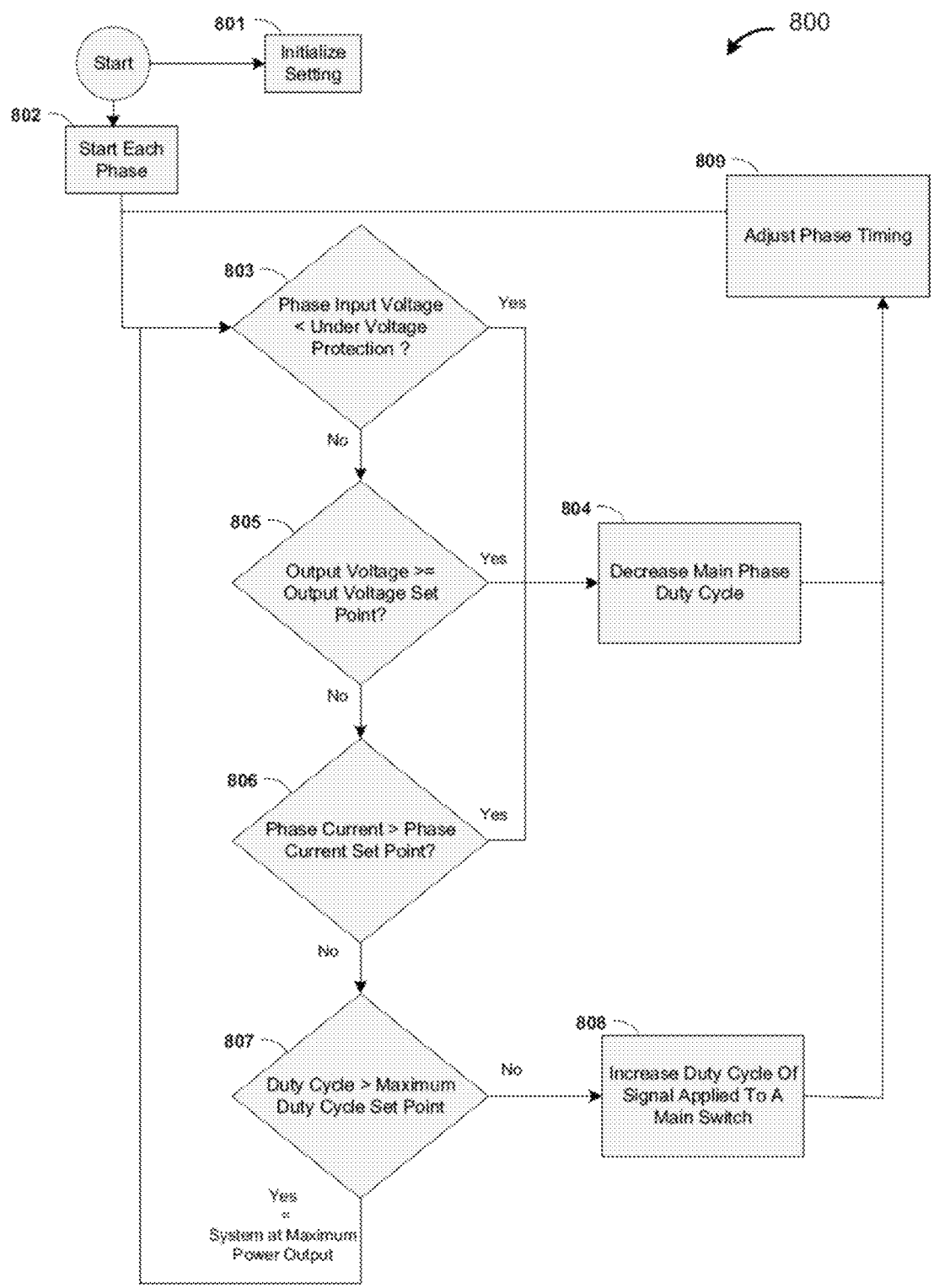
FIG. 8 is a flowchart of an example method for power management, in accordance with some embodiments.

FIG. 8 is a flowchart of a method 800 for power management. A control module (e.g., the control module 120, a controller/driver, etc.) may be configured with a plurality of power converters to form a power management system (e.g., the system 100, etc.). The system may be an n-th phase (multiphase) interleaved system where the phases are based on the quantity of sources and associated quantity of power converters. Each power converter of the plurality of power converters may be connected to a different source, such as one or more photovoltaic cells of a solar module, one or more cells of a multi-cell battery/source, one or more energy harvesting devices (e.g., thermoelectric devices, etc.), one or more energy harvesting devices configured/embedded within an organic organism (e.g., jellyfish, etc.) and/or organic material (e.g., muscle tissue, etc.), and/or the like. In some cases, the control module and power converters may be embedded with one or more photovoltaic cells of a solar module, one or more cells of a multi-cell battery/source, one or more energy harvesting devices, and/or the like. At 801, settings of the system may be determined. For example, the output voltage may be set to zero volts, all phase currents limit set points may be set to a minimum limit set point, and/or any other desired setting may be determined.

At 802, the system may start. The control module causes the system to initiate with a soft start (via a soft-start algorithm and/or circuit, etc.) to slow down the rate of rising output voltage (based on a maximum output voltage set point) by minimizing any excess current flow during the start. The control module may begin to synchronously control conduction associated with each power converter of the plurality of power converters. The control module may start each phase of the system.

At 803, the control module may determine the amount of input voltage associated with its respective phase. The control module may determine whether the phase input voltage is less than an under voltage protection value. If the phase input voltage is less than the under voltage protection value, the control module may, at 804, cause a decrease in the duty cycle of a main switch (e.g., the main switch 105, the main switch 106, etc.) of a power converter of the plurality of power converters for a given phase. In some instance, a decrease in the duty cycle of a main switch may cause an increase in the duty cycle for a synchronization signal (e.g., a digital control signal, etc.) for the phase. Decreasing the duty cycle of the main switch may cause less power contributed to the output (a load) for the phase. If the phase input voltage is not less than the under voltage protection value, then the control module may, at 805, determine if the output voltage is greater than or equal to an output voltage set point (e.g., a set/desired output voltage level). If the output voltage is greater than or equal to the output voltage set point, the control module may (step 804) cause a decrease in the duty cycle of the main switch (e.g., the main switch 105, the main switch 106, etc.) of the power converter of the plurality of power converters for the phase. If the output voltage is not greater than or equal to the output voltage set point, then the control module may, at 806, determine whether the phase current is greater than a phase current set point. If the phase current is greater than the phase current set point, the control module may (step 804) cause a decrease in the duty cycle of the main switch (e.g., the main switch 105, the main switch 106, etc.) of the power converter of the plurality of power converters for the phase. If the phase current is not greater than the phase current set point, the control module may, at 807, determine whether the duty cycle is greater than a maximum duty cycle set point. If the duty cycle is greater than the maximum duty cycle set point then it may be assumed that the system has exceeded the performance of the boost converter phase and the control module may again determine if the phase input voltage is less than the under voltage protection value (e.g., the control module may return to step 803, etc.). In some instances, steps 803 and 805-807 may be performed/executed concurrently. In some instances, steps 803 and 805-807 may be performed/executed sequentially. If the duty cycle is not greater than the maximum duty cycle set point, the control module may, at 808, cause an increase in the duty cycle of the main switch (e.g., the main switch 105, the main switch 106, etc.) of the power converter of the plurality of power converters for the given phase. Increasing the duty cycle may cause more power to be contributed to the output (a load) from the phase.

At 809, the control module may adjust phase timing. For example, for a two-phase system, the control module may adjust the phase timing for half phase delay on the center of a synchronization signal (e.g., a digital control signal, etc.) for the phase. Adjusting the phase timing for half phase delay on the center of the synchronization signal for the phase may cause a reduction in output voltage ripple and cause an output that requires less filtering. The control module may adjust phase timing for any multiphase system to reduce output voltage ripple and filtering requirements.

In some instances, the control module may perform maximum power point tracking of the system. For example, after the soft start voltage ramp, the control module may, for each phase, determine the phase input voltage and the phase current to determine a phase current set point and adjust the phase current set point to ensure optimal power output of the system.

In an embodiment, illustrated in FIG. 9, the system 100, and/or any other device/component described herein can be configured to perform a method 900. At 910, power may be transferred to a load. For example, a system may include a control module and two or more power converters configured (e.g., embedded, etc.) with a power source(s), such as cells of a photovoltaic module (e.g., a solar module, one or more photovoltaic cells of a photovoltaic cell-string, etc.), one or more cells of a multi-cell battery, one or more energy storing current sources, one-or-more electrodes harvesting energy individually from a non-discrete power source (e.g., perovskite-painted surfaces, etc.), one or more energy-harvesting devices, one or more thermoelectric devices, and/or the like. The control module may cause optimal power (e.g., wattage) to be transferred from the power source (e.g., components of the power source, etc.) to a load (e.g., a power inverter, an energy storage device, a heating element, a resistive load, an inductive load, a capacitive load, etc.) while minimizing transients (e.g., inductive switching transients, etc.). The control module may transfer, for each phase of a multiphase cycle, power from a different source of a plurality of sources to a load. The control module may transfer the power by managing switching/activation operations of each phase.

At 920, the control module may determine, for each phase of the multiphase cycle, an input voltage associated with the transferred power, an output voltage associated with the transferred power, and an input current from the source associated with the transferred power. For example the control module may be configured with and/or in communication with one or more sensing circuits/modules that determine/detect the input voltage associated with the transferred power, the output voltage associated with the transferred power, and the input current from the source associated with the transferred power.

At 930, the control module may determine a duty cycle associated with the source.

At 940, the control module may modify the output voltage associated with the transferred power, the current from the source, and or the duty cycle associated with the source. The control module may cause such modifications based on the input voltage associated with the transferred power. The duty cycle associated with the source may be increased or decreased based on one or more of the input voltage not satisfying an input voltage level threshold, the output voltage satisfying an output voltage level threshold, or the input current from the source exceeding a current level threshold.

At 950, the control module may modify timing for each phase of the multiphase cycle. The control module may modify the timing for each phase of the multiphase cycle based on the modified duty cycle. For example, modifying the timing for each phase of the multiphase cycle may include delaying, based on the conductive state of the respective source to the load, each phase of the multiphase cycle so that each of the transition times between each of the phases of the multiphase cycle are equivalent to each other.

Figure 10:
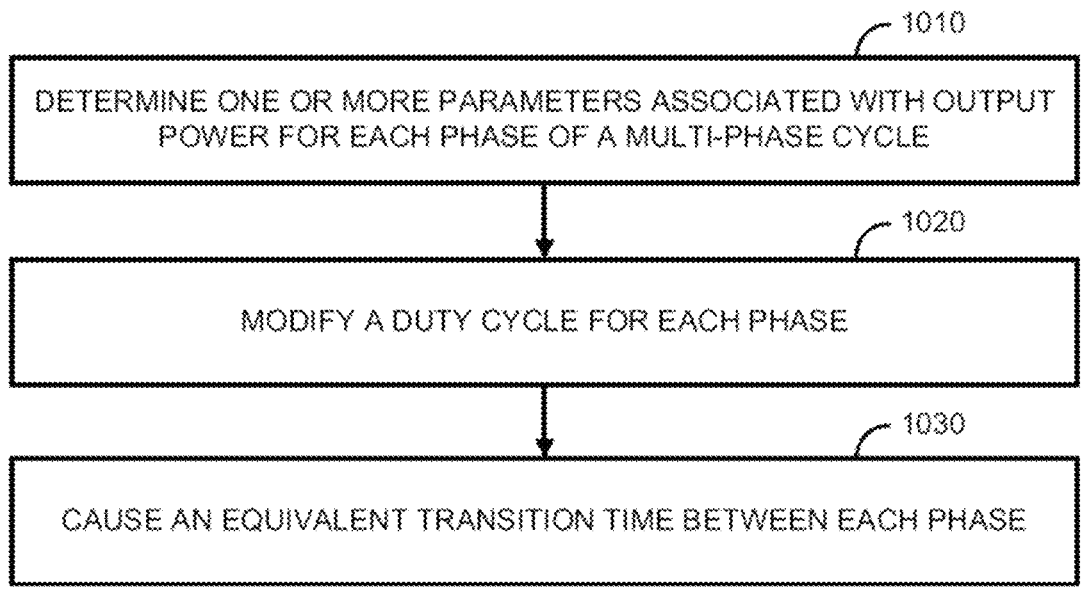
FIG. 10 is a flowchart of an example method for power management, in accordance with some embodiments.

In an embodiment, illustrated in FIG. 10, the system 100, and/or any other device/component described herein can be configured to perform a method 1000. At 1010, one or more parameter values associated with output power may be determined. For example, a system may include a control module and one or more power converters configured (e.g., embedded, etc.) with a power source(s), such as cells of a photovoltaic module (e.g., solar module, etc.), one or more cells of a multi-cell battery, one or more energy storing current sources, one-or-more electrodes harvesting energy individually from a non-discrete power source (e.g., perovskite-painted surfaces, etc.), one or more energy-harvesting devices, one or more thermoelectric devices, and/or the like. The control module may cause optimal power (e.g., wattage) to be transferred from the power source (e.g., components of the power source, etc.) to a load (e.g., a power inverter, an energy storage device, a heating element, a resistive load, an inductive load, a capacitive load, etc.) while minimizing transients (e.g., output voltage transients such as transients caused by intermittent current to the load from switched mode power supplies, etc.). The control module may transfer, for each phase of a multiphase cycle, power from a different source of a plurality of sources to a load. The control module may transfer the power by managing switching/activation operations of each phase. The one or more parameters may include an input voltage value associated with the transferred power, an output voltage value associated with the transferred power, and/or an input current level from the source associated with the transferred power.

At 1020, the duty cycle of a synchronization switching component associated with a given phase may be modified. The control module may modify the duty cycle based on the one or more parameter values. For example, the control module may determine whether the input voltage value satisfies an input voltage level threshold (e.g., an under voltage set point, etc.), whether the output voltage value satisfies an output voltage level threshold (e.g., greater than or equal to an output voltage set point, etc.), or the current from the source exceeds a current level threshold (e.g., is phase current greater than a phase current set point, etc.), and increase/decrease the duty cycle accordingly.

At 1030, the transition times between each phase of the multiphase cycle may be adjusted to be equivalent. The control module may cause, based on the modified duty cycle for each phase of the multiphase cycle, an equivalent transition time between each phase of the multiphase cycle. The equivalent transition times may cause a reduction in output voltage ripple so that filtering requirements of the system are reduced.

Figure 11:
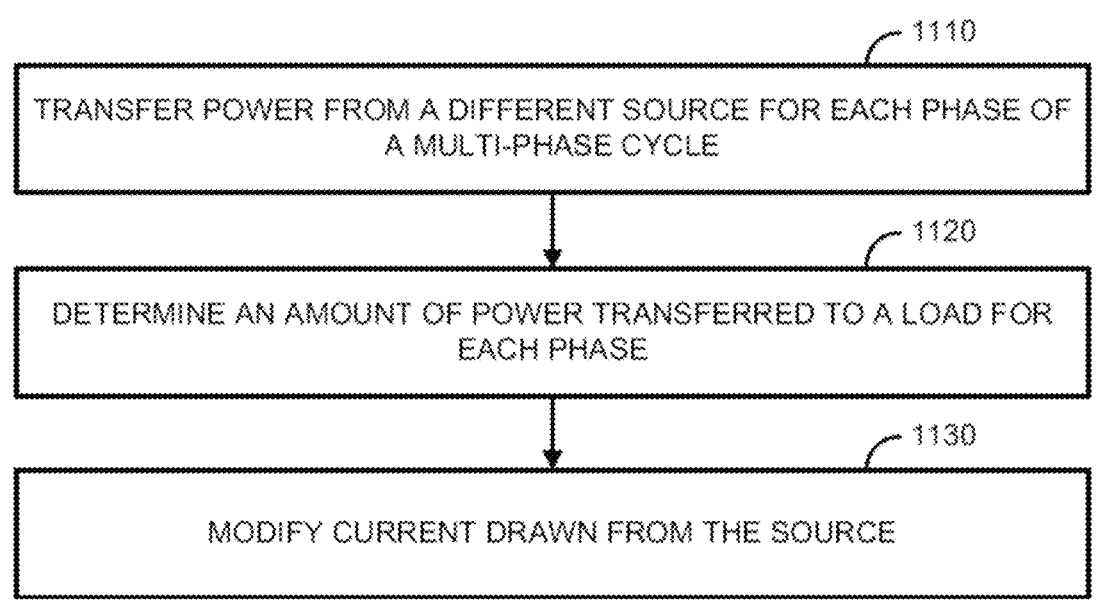
FIG. 11 is a flowchart of an example method for power management, in accordance with some embodiments.

In an embodiment, illustrated in FIG. 11, the system 100, and/or any other device/component described herein can be configured to perform a method 1100. At 1110, power may be transferred to a load. For example, a system may include a control module and one or more power converters configured (e.g., embedded, etc.) with a power source(s), such as cells of a photovoltaic module (e.g., solar module, etc.), one or more cells of a multi-cell battery, one or more energy storing current sources, one-or-more electrodes harvesting energy individually from a non-discrete power source (e.g., perovskite-painted surfaces, etc.), one or more energy-harvesting devices, one or more thermoelectric devices, and/or the like. The control module may cause optimal power (e.g., wattage) to be transferred from the power source (e.g., components of the power source, etc.) to a load (e.g., a power inverter, an energy storage device, a heating element, a resistive load, an inductive load, a capacitive load, etc.) while minimizing transients (e.g., output voltage transients such as transients caused by intermittent current to the load from switched mode power supplies, etc.). The control module may transfer, for each phase of a multiphase cycle, power from a different source of a plurality of sources to a load. The control module may transfer the power by managing switching/activation operations of each phase.

At 1120, an amount of power transferred from the source to the load may be determined. For example, the control module may be in communication with (connected to) one or more sensors (sensing circuits) that detect/determine, based on an input voltage associated with source and current drawn from the source, the amount of power transferred from the source to the load.

At 1130, an amount of current drawn from the source may be modified. The control module may modify, based on the amount of power transferred from the source to the load, current drawn from the source. As described, the control module may perform maximum power point tracking and adjust the system accordingly.

In some instances, the current (and/or voltage polarity) for the systems described herein (e.g., system 100 in FIG. 1) may be reversed, causing current from the load (e.g., 107 in FIG. 1) to be routed through a source (e.g., source 103 and/or source 104 in FIG. 1) or through a heating element. In some instances, the current (and/or voltage polarity) for the systems described herein (e.g., system 100 in FIG. 1) may be reversed, causing power from the load (e.g., 107 in FIG. 1) to be transferred to a source (e.g., source 103 and/or source 104 in FIG. 1) or to a heating element. The load in such cases can be any electrical load from which current (and/or power) can be drawn, such as a power inverter, an energy storage device, a heating element, an inductive load, a capacitive load. As described in greater detail above, the current (and/or voltage polarity) can be reversed by the control module (e.g., 120 in FIG. 1) turning on a sync switch (e.g., 111 and/or 112 in FIG. 1) at a time period when a boost convertor (e.g., 101 and/or 102 in FIG. 1) is operating below the load voltage.

Providing current (and/or power) from the load to a source may increase the temperature of the source. Heating the source may in turn increase the temperature of a substrate coupled to the source, and/or increase the temperature of a housing containing the source or coupled to the source. For example, in the case where the source is a solar cell and the load is an energy grid or an energy storage system (e.g., a battery system), sending a reverse current from the load to the solar cell that causes the solar cell to be in reverse bias will cause the solar cell to heat up. Heating the solar cell can then in turn heat a substrate (e.g., glass) or housing of a solar module, which can be beneficial for example to melt snow that has accumulated on the solar module.

In some cases, current can be routed from a load through a heating element instead of (or in addition to) routing current from a load directly through one or more sources. In some cases, power can be transferred from a load to a heating element instead of (or in addition to) transferring power from a load directly to one or more sources. The heating element may be configured to increase the temperature of a source of the plurality of sources, and/or the heating element may be configured to heat a substrate coupled to the source and/or a housing coupled to or containing the source. For example, the heating element may be embedded with the sources within an apparatus or device, or may be external to an apparatus or device containing the sources. In some cases, the load (e.g., 107 in FIG. 1) is coupled to the sources with a set of electrical connections that are used to route current from the load through the source and/or transfer power from the load to the source, and the same electrical connections can be used to route current from the load through a heating element and/or transfer power from the load to the heating element (e.g., using a bypass diode, a switch, and/or a switch with a sensor). In some cases, the load is coupled to the sources with a first set of electrical connections, and the load is coupled to one or more heating elements with a second set of electrical connections, where the first set of electrical connections can route current from the load through one or more sources, and the second set of electrical connections can route current from the load through one or more heating elements.

Reversing the current to route current from the load through a source or heating element and/or transfer power from the load to a source or a heating element can be beneficial in several different applications. For example, the sources can be solar cells of a solar module, and heating one or more of the solar cells and/or one or more heating elements can improve the power conversion efficiency of the solar module by melting snow that is shading the solar module. In another example, the source is a cell of a battery and sending reverse current to the battery cell (or to a heating element configured to increase the temperature of the battery cell) can improve the efficiency of the battery. In another example, sending current from the load to a source can cause the source to emit light (e.g., a solar cell in reverse bias can emit infrared light). In other examples, the sources can include neurons, muscle fibers, batteries and/or electro-stimulation devices.

FIGS. 12A-21 show simplified schematics of examples of systems for power management, where the systems are configured to route current from a load (e.g., 107 in FIG. 1) through one or more sources and/or one or more heating elements, and/or to transfer power from a load to one or more sources and/or one or more heating elements.

Figure 12A:
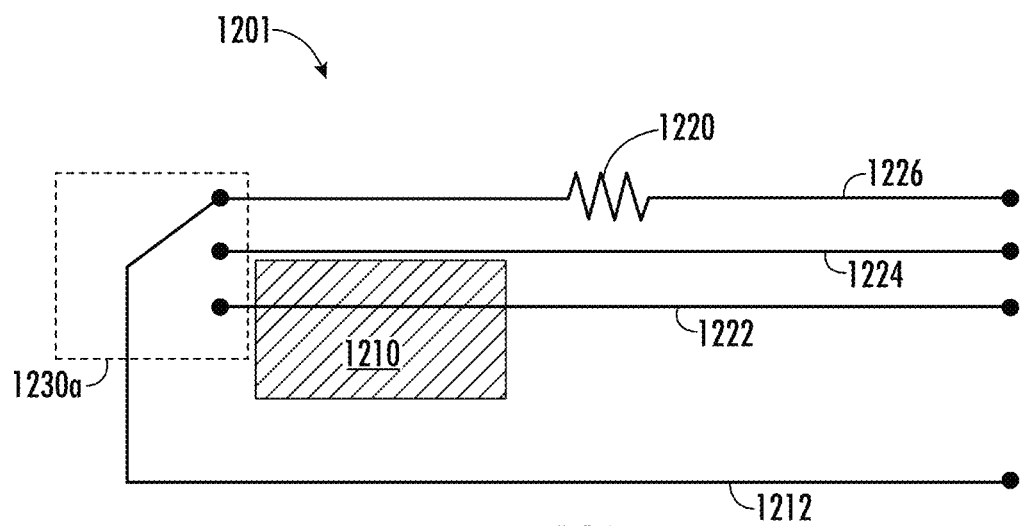
FIGS. 12A, 12B and 12C show simplified schematics of examples of subsystems for power management, in accordance with some embodiments.
Figure 12B:
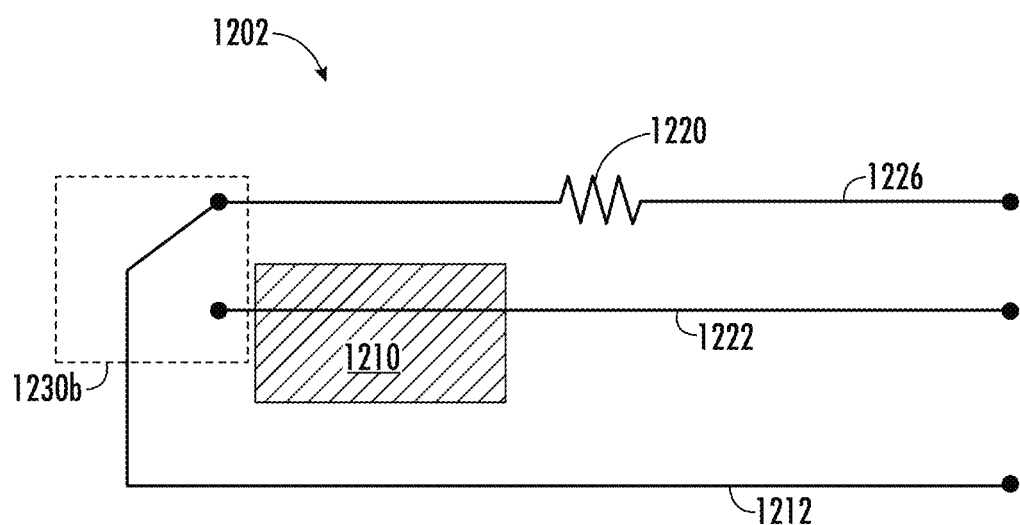

FIGS. 12A and 12B show simplified schematics of examples of subsystems 1201 and 1202 for power management. The systems 1201 and 1202 are configured to route current from a load (e.g., 107 in FIG. 1) through one or more sources 1210 and/or through one or more heating elements 1220, and/or to transfer power from a load to one or more sources and/or to one or more heating elements. Subsystem 1201 includes a single source 1210 and a heating element 1220 coupled with electrical connections 1212, 1222, 1224, and 1226. Subsystem 1202 includes single source 1210 and heating element 1220 coupled with electrical connections 1212, 1222, and 1226. The subsystems 1201 and 1202 can be part of a power management system controlled by a control module, such as in system 100 in FIG. 1. The control module (not shown) can control the system (e.g., by turning switches on and off) to route current from the source 1210 through a load (not shown) using terminals 1212 and 1222, and can also reverse the current, routing current from the load through the source 1210 or through the heating element 1220, by changing the state of switch 1230*a* or 1230*b*. When current is routed from the source 1210 through the load, the switches 1230*a* and 1230*b* connect electrical connections 1212 and 1222. When the current is reversed, and current is routed from the load through the source 1210, the state of the switch is changed to connect electrical connections 1212 and 1222. When the current is reversed, and current is routed from the load through the heating element 1220, the state of the switch is changed to connect electrical connections 1212 and 1226. In some cases, electrical connection 1222 is disconnected and the source 1210 is prevented from absorbing power when the current is reversed. FIG. 12A also includes an optional bypass electrical connection 1224, which can be used to route current (forward or reverse) through subsystem 1201 without passing through source 1210 or heating element 1220. The switches 1230*a* and 1230*b* can be any type of switch enabling connecting and disconnecting electrical connections 1212, 1222, 1226, and optionally 1224. For example, the switches 1230*a-b* can be multipoint switches, toggle switches, or other type of switch. Switches 1230*a-b* can also be replaced by bypass diodes and/or variable resistors to select connecting and disconnecting electrical connections 1212, 1222, 1226, and optionally 1224, in some embodiments. Switches 1230*a-b* may be active (e.g., activated by a control signal) or passive (e.g., activated by reversing the current direction and/or using a sensor (e.g., triggering the switch based on a light or temperature measurement)). In cases where the switches 1230*a-b* are activated by a control signal, the control signal can be sent to switches 1230*a-b* from a processor (e.g., control module 120 in FIG. 1). In such active cases, the operation of switches 1230*a-b* can be coordinated with other switches in power electronics (e.g., switches 105, 106, 111 and 112 in system 100 in FIG. 1) that control the timing of current routed from sources through a load, and/or from the load through the sources and/or heating elements.

FIGS. 12A and 12B show that even without reversing the current, heating paths may be employed, for example, to remove snow from covered cells. FIG. 12A shows an example wherein switches of two poles are placed to allow bypass of one or more sources 1210 in series. The heating element can be configured to heat only when the current is reversed, only heat when the current is in the forward direction, or when the current is in the forward or reverse direction. Switches with three poles would constitute a further refinement allowing cells to be bypassed with lower resistance so that heating is localized to resistive elements associated with specific cells (e.g., specific solar cells under snow). In some cases, bypass diodes could be used as the switches. In some cases, bypass diodes incur significant losses during normal operation (e.g., when current is being routed from the source through the load and through a diode, and/or when power is being transferred from the source to the load through a diode), and switches (e.g., transistors, or mechanical switches) with less losses (e.g., less resistive losses) are used.

Figure 12C:
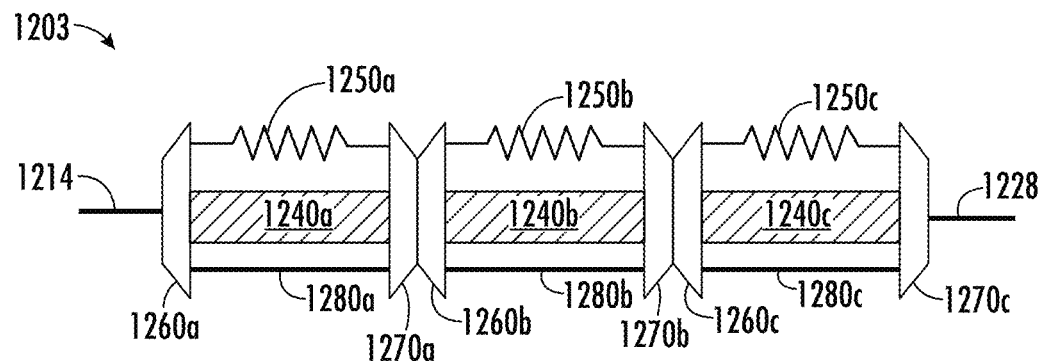

FIG. 12C shows a simplified schematic of an example of a subsystem 1203 for power management configured to route current from a load (e.g., 107 in FIG. 1) through heating elements 1250a-c, and/or to transfer power from a load to heating elements 1250a-c. Subsystem 1203 includes electrical connections 1214 and 1228 connecting sources 1240a-c and heating elements 1250a-c to an outside circuit (e.g., containing a load, such as 107 in FIG. 1), and bypass electrical connections 1280a-c. In some cases, sources 1240a, 1240b and 1240c can each be an individual source, and in other examples, each source (1240a, 1240b and/or 1240c) can be a group (or a string) of sources (e.g., containing from 1 to 10 sources, or from 1 to 100 sources, or more than 100 sources). Subsystem 1203 includes (de)multiplexers 1260a-c and (de)multiplexers 1270a-c that are used to route current to sources 1240a-c and/or heating elements 1250a-c. Depending on the direction of current flow, elements 1260a-c and 1270a-c may be multiplexers or demultiplexers. For example, current may be routed from electrical connection 1214 (e.g., from a load) through demultiplexer 1260a, which can direct the current through heating element 1250a, source 1240a, and/or bypass electrical connection 1280a. In this example, multiplexer 1270a then directs the current from heating element 1250a, source 1240a, or bypass electrical connection 1280a and routes the current through demultiplexer 1260b. Demultiplexer 1260b operates similarly to demultiplexer 1260a and may route current through heating element 1250b, source 1240b, and/or bypass electrical connection 1280b. Multiplexer 1270b and 1270c operate similarly to multiplexer 1270a, and demultiplexer 1260c operates similarly to demultiplexer 1260a and 1260b to direct where current is routed in subsystem 1203. If the direction of the current is reversed, from electrical connection 1228 to electrical connection 1214, then the multiplexers in subsystem 1203 become demultiplexers, and vice-versa. In other words, in the case of reverse current, elements 1270a-c operate as demultiplexers, and 1260a-c operate as multiplexers, and the multiplexers and demultiplexers operate similarly as described above with respect to the forward current case.

The demultiplexers 1260a-c may be active (e.g., activated by a control signal) or passive (e.g., activated by reversing the current direction and/or using one or more sensors (e.g., triggering the switch based on a light or temperature measurement)). In cases where the switches 1230a-b are activated by a control signal, the control signal can be sent to switches 1230a-b from a processor (e.g., control module 120 in FIG. 1). In such active cases, the operation of switches 1230a-b can be coordinated with other switches in power electronics (e.g., switches 105, 106, 111 and 112 in system 100 in FIG. 1) that control the timing of current routed from sources through a load, and/or from the load through the sources and/or heating elements. Subsystem 1203 may route current through heating elements 1250a-c when the current is in the forward or reverse directions. For example, when current flows in a forward direction and current is routed from sources 1240a-c through a load, the current flows from electrical connection 1214 to electrical connection 1228. When current flows from electrical connection 1228 to electrical connection 1214, the current is flowing in a reverse direction. The demultiplexers 1270a-c may route current through a heating element when the current flows from electrical connection 1214 to electrical connection 1228 or from electrical connection 1228 to electrical connection 1214. In some cases, such as in the case of a solar cell, when current is routed in the forward direction the source will produce electrical power, and when current is routed in the reverse direction the source absorbs electrical power and will heat up (and/or produce light). In some cases, current can be routed from a source 1240a-c through a load and current can be routed through heating element 1250a-c simultaneously, using the (de)multiplexers 1260a-c and 1270a-c. Additionally, in some cases, power can be transferred from a source 1240a-c to a load and power can be transferred to heating element 1250a-c simultaneously, using the (de)multiplexers 1260a-c and 1270a-c.

The heating elements 1220 and/or 1250a-c of subsystems 1201, 1202 and 1203 can comprise an element (e.g., an electrically conductive wire) that heats up due to resistive heating, or it can be a heating unit coupled to the sources 1210 or 1240a-c with electrical connections. For example, the heating element 1220 can be resistive wire configured to heat up when current flows through the wire. In another example, the heating element 1220 can be a heating unit comprising a heater (optionally within a heating unit package) configured to heat up when current flows through the heating unit. The heating element(s) can be any shape or geometry, and can be embedded with sources within an apparatus or device, or can be coupled to an apparatus or device containing the sources. The heating element can be located adjacent to (or close to, or within a certain proximity of) a source such that heat from the heating element can increase the temperature of the source, a substrate coupled to the source, and/or a housing containing the source, when the current is reversed by the control module. For example, the heating element(s) may be embedded between a source and a substrate or a housing. The heating element(s) can be inside the housing (e.g., inside a solar module) and close to the surface of the housing (e.g., within 0.1 inches of the surface of the housing). The amount of power routed through the heating element(s) can vary widely depending on the application. For example, a solar module may require from 100 W/m$^2$ to 500 W/m$^2$, or about 250 W/m$^2$ to melt snow. In another example, power equal to or less than the rated output power of a battery can be transferred to a heating element configured to increase the temperature of a battery cell. In another example, one or more heating elements and sources (e.g., solar cells) can be coupled to an article of clothing and power can be transferred to the heating elements from the sources or from a load (e.g., a battery). In some cases, power can be delivered unevenly to heating elements coupled to different parts of an article of clothing, because different temperatures are desired.

Figure 13:
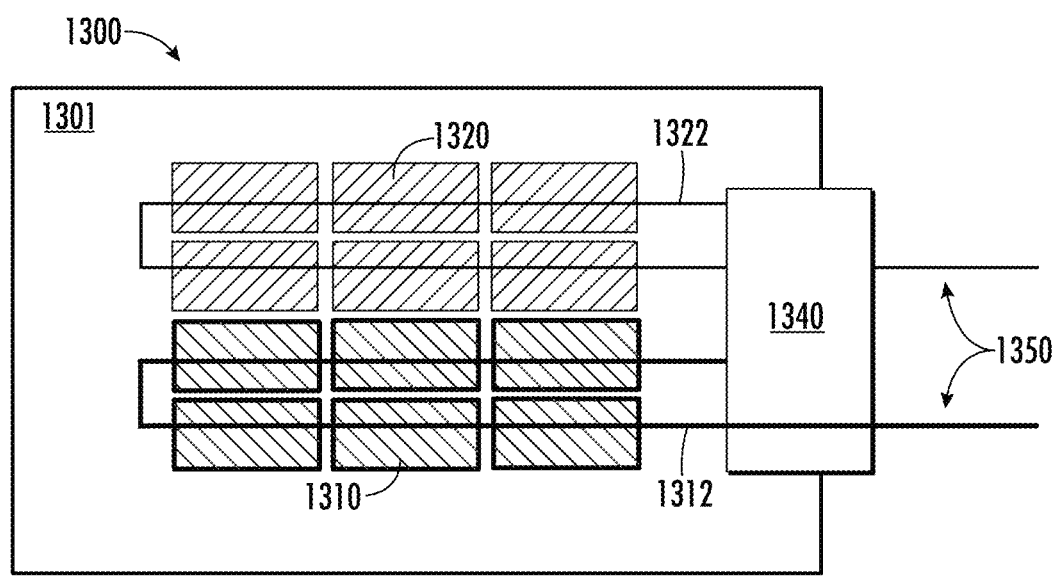
FIG. 13 shows a simplified schematic of an example of a subsystem for power management, in accordance with some embodiments.

FIG. 13 shows a simplified schematic of an example of a subsystem 1300 for power management, where the subsystem 1300 is configured to route current from a load (e.g., 107 in FIG. 1) through one or more sources. Subsystem 1300 includes two strings of sources 1310 and 1320 coupled to power electronics 1340 using electrical connections 1312 and 1322, respectively. The power electronics 1340 have a second set of electrical connections 1350, which couple the power electronics 1340 to a load (not shown). The strings of sources 1310 and 1320 each contain 6 sources connected in series (as shown by the electrical connections 1312 and 1322, respectively). In other examples, strings of sources can contain more or fewer than 6 sources (e.g., from 1 to 100, or more than 100 sources), and can be arranged in any manner, such as in series, in parallel, or in a combination of series and parallel. The strings of sources 1310 and 1320 are coupled to substrate 1301. The strings of sources 1310 and 1320 can be strings of solar cells coupled to a substrate 1301 that is a part of a solar module. In other cases, the sources making up strings of sources 1310 and 1320 can include neurons, muscle fibers, batteries and/or electrostimulation devices. The substrate 1301 can be glass, or other rigid or flexible material. In some cases the substrate 1301 is part of a housing, a solar module, a biological system (e.g., surrounding tissues), a battery, or any electronic device with sources (as descried herein).

The subsystem 1300 can perform similar functions as the power management system 100 in FIG. 1. Accordingly, power electronics 1340 can contain some of the elements shown in FIG. 1 arranged in the same manner, such as main switches, sync switches, inductors, capacitors, and a control module. The control module (or other processor) of the power electronics 1340 can control switches within power electronics 1340 similar to, or the same as, the systems described herein (e.g., system 100 in FIG. 1) to determine which source string of sources 1310 and/or 1320 sends current or voltage to a load (not shown). The control module (or other processor) of the power electronics 1340 can also control switches within power electronics 1340 to reverse the current (or the voltage polarity) to route current from the load through string of sources 1310 and/or 1320.

Subsystem 1300 shows an example where one string of sources 1320 is receiving current from the load (not shown) and the other string of sources 1310 is not receiving current from the load (at the same instant in time). Subsystem 1300 also shows an example where a string of sources 1320 is receiving current from a load and the sources themselves are absorbing power from the load. In other examples, additional heating elements, separate from the sources, are used.

Subsystem 1300 can be used to heat the strings of sources 1310 and/or 1320 using the systems described herein (e.g., system 100 in FIG. 1) to intermittently route current from the sources 1310 and/or 1320 through a load and then reverse the current (or voltage polarity) and route current intermittently from the load through the sources 1310 and/or 1320. This would enable the system to intermittently heat the sources 1310 and/or 1320 and draw power from sources 1310 and/or 1320. Additionally, using the switches (e.g., 105, 106, 111 and 112 in FIG. 1) of the power management systems described herein, current can be routed from one or more strings of sources (e.g., 1310) through the load in a first phase of a multiphase cycle (or in a first portion of a duty cycle), and current can be routed from the load through one or more strings of sources (e.g., 1320) in a second phase of the multiphase cycle (or in a second portion of the duty cycle). The switches (e.g., 105, 106, 111 and 112 in FIG. 1) of the power management systems described herein can also enable power to be transferred from one or more strings of sources (e.g., 1310) to the load in a first phase of a multiphase cycle (or in a first portion of a duty cycle), and power to be transferred from the load to one or more strings of sources (e.g., 1320) in a second phase of the multiphase cycle (or in a second portion of the duty cycle). The percentage of time (over a duty cycle, or over any period of time) that current is routed from the strings of sources 1310 and/or 1320 through the load, and the percentage of time that current routed from the load through one or more sources of strings of sources 1310 and/or 1320 can be any value from 0% to 100%, or any value in between, in different embodiments. The different strings of sources can be coupled to the same substrate (e.g., 1301) or can be coupled to separate substrates, in other examples.

Subsystem 1300 can be used to heat some of the sources coupled to the substrate 1301 and not heat others. In subsystem 1300, the string of sources 1320 is heating and the string of sources 1310 is not heating. This type of partial heating of the sources within a device or set of devices can be useful for various reasons. For example, in the case of solar modules mounted at an angle that are covered in snow, heating solar cells at the top of a module to melt the snow on that portion can cause all of the snow to slide off of the module. In another example of solar modules covered in snow, selectively melting all or some of the depth of the snow (e.g., off of some modules and not others in an array of modules, or off of some portions of a module and not other portions of a module) can be used to create a picture or message, such as text (e.g., advertisements or holiday messages), company logos, or any pattern. In another example, subsystem 1300 can be used to heat some cells (or groups of cells) of a battery, and not heat other cells of the battery.

The power electronics 1340 of subsystem 1300 can also utilize calculations, simulations, weather forecasts, and/or other data to determine how to direct current (e.g., using switches 105, 106, 111 and 112 in FIG. 1). The calculations, simulations, weather forecasts, and/or other data can be used by subsystem 1300 to determine if there is a need to route current from a load through a source (or heating element, not shown in FIG. 13), and/or if sending current from a load to a source (or heating element) would be beneficial. For example, in the case of a solar module covered in snow, a processor (e.g., 120 in FIG. 1) of power electronics 1340 can use algorithms to determine if using power to melt the snow would be likely to result an overall increase in the power production of the solar module. Such an algorithm can take into account any type of data, such as environmental measurements (e.g., ambient temperature, snow depth (e.g., on a module, and/or on the ground), and/or solar irradiance), characteristics of the solar module (e.g., module temperature, current power production, and/or power production history), and/or weather information (e.g., historical weather information, and/or weather signals (e.g., from a National Oceanic and Atmospheric Administration (NOAA) broadcast)).

Figure 14A:
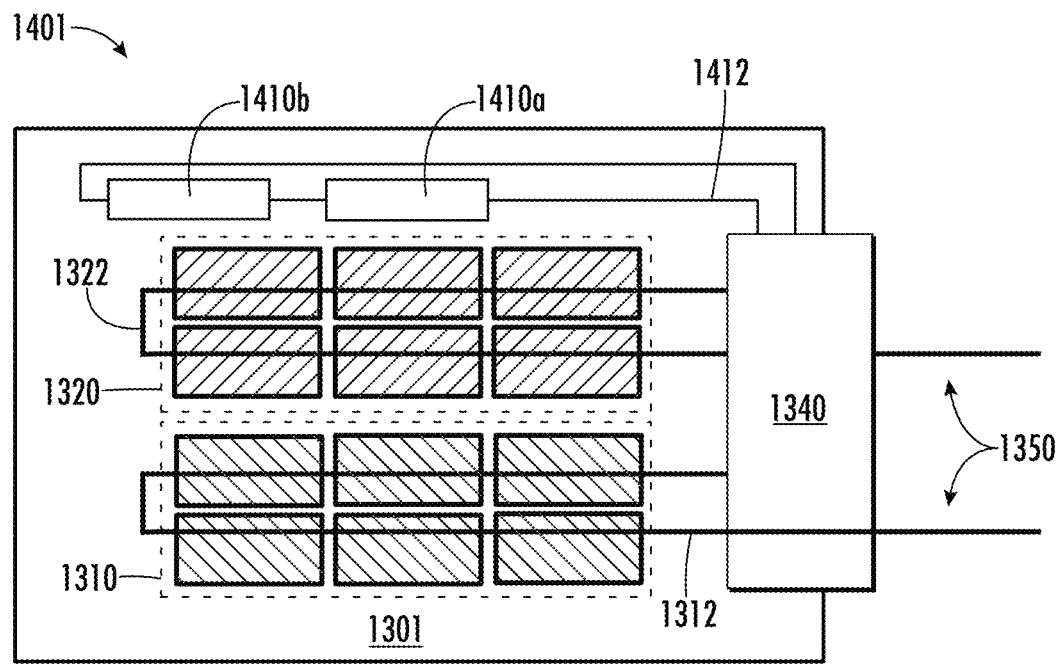
FIGS. 14A and 14B show simplified schematics of examples of subsystems for power management, in accordance with some embodiments.
Figure 14B:
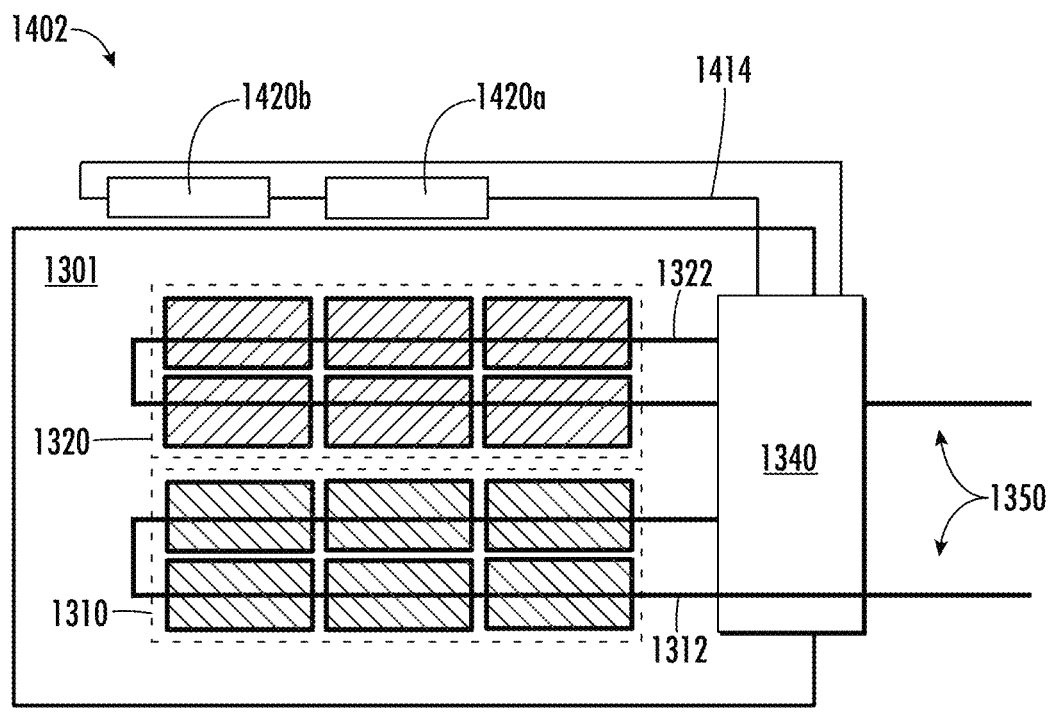

FIGS. 14A and 14B show simplified schematics of examples of subsystems for power management, 1401 and 1402, respectively. Subsystems 1401 and 1402 contain strings of sources 1310 and 1320, power electronics 1340, and heating elements 1410a-b and 1420a-b. Subsystems 1401 and 1402 are configured to route current from a load (e.g., 107 in FIG. 1) through one or more strings of sources 1310 and/or 1320, and/or through one or more heating elements 1410a-b and 1420a-b, respectively. Subsystems 1401 and 1402 are also configured to transfer power from a load (e.g., 107 in FIG. 1) to one or more strings of sources 1310 and/or 1320, and/or to one or more heating elements 1410a-b and 1420a-b, respectively. Some components (e.g., 1301, 1310, 1312, 1320, 1322, 1340 and 1350) of subsystems 1401 and 1402 are the same as and perform the same functions as those described above with respect to subsystem 1300 in FIG. 13. Subsystems 1401 and 1402 include heating elements that are separate from the strings of sources 1310 and 1320, and are coupled to the power electronics 1340 using separate electrical connections. The subsystems 1401 and 1402 can perform similar functions as the power management system 100 in FIG. 1, as described above with respect to subsystem 1300 in FIG. 1. In some cases, power electronics 1340 of subsystems 1401 and 1402 contain switches (similar to switches 1230*a* or 1230*b* in FIGS. 12A and 12B, respectively) to direct the current through the sources 1310 and/or 1320 and/or through heating elements 1410*a-b* or 1420*a-b*.

Subsystems 1401 and 1402 show examples where two heating elements are coupled to the power electronics 1340 using a single electrical connection. In other cases (not shown), there can be one heating element, or more than 2 heating elements (e.g., from 2 to 10, or from 2 to 100 heating elements). In some cases, multiple heating elements (either internal, or external, or a mix of internal and external heating elements) can be coupled to the power electronics using a set of electrical connections, where the power electronics and the electrical connections are configured to route current from a load through one or more heating elements. For example, the heating elements, power electronics and electrical connections can be configured to selectively heat some sources and not others (e.g., in a spatial pattern, or in response to additional data provided to the power electronics 1340) and/or to route current from the load through different heating elements at different times (e.g., different times within a duty cycle, or different times within a day).

Subsystem 1401 includes internal heating elements 1410*a* and 1410*b* that are electrically coupled to the power electronics 1340 using electrical connection 1412, which is separate from the electrical connections 1312 and 1322 that couple the strings of sources 1310 and 1320 to the power electronics 1340. The internal heating elements 1410*a* and 1410*b* may be embedded with the strings of sources 1310 and 1320 within an apparatus or device (e.g., within a solar module, or other electronic device). The internal heating elements 1410*a* and 1410*b* may be configured to increase the temperature of one or more sources of strings of sources 1310 and/or 1320 and/or may be configured to increase a temperature of a substrate coupled to, or a housing containing, sources 1310 and 1320. For example, they may be located adjacent to (or close to, or within a certain proximity of) one or more sources of strings of sources 1310 and/or 1320, such that heat from the heating element(s) can increase the temperature of the one or more sources when the current is routed from a load through the heating elements 1410*a* and/or 1410*b*. In another example, they may be located adjacent to (or close to, or within a certain proximity of) a substrate coupled to, or a housing containing, strings of sources 1310 and/or 1320, such that heat from the heating element(s) can increase the temperature of the substrate or housing when the current is routed from a load through the heating elements 1410*a* and/or 1410*b*.

Subsystem 1402 includes external heating elements 1420*a* and 1420*b* that are electrically coupled to the power electronics 1340 using electrical connection 1414, which is separate from the electrical connections 1312 and 1322 that couple the strings of sources 1310 and 1320 to the power electronics 1340. The external heating elements 1420*a* and 1420*b* may be physically coupled to an apparatus or device (e.g., a solar module, or other electronic device) that contains the strings of sources 1310 and 1320. The external heating elements 1420*a* and 1420*b* may be configured to increase the temperature of one or more sources of strings of sources 1310 and/or 1320, and/or may be configured to increase a temperature of a substrate coupled to, or a housing containing, sources 1310 and 1320. For example, external heating elements 1420*a* and 1420*b* may be located close to (or within a certain proximity of) one or more sources of strings of sources 1310 and/or 1320, to a substrate, or to a housing, such that heat from the heating element(s) can increase the temperature of the one or more sources, substrate, and/or housing when the current is routed from a load through the heating elements 1420*a* and/or 1420*b*.

Subsystems 1401 and 1402 can be used to heat one or more sources of the strings of sources 1310 and/or 1320 using the systems described herein (e.g., system 100 in FIG. 1) to intermittently route current from the sources 1310 and/or 1320 through a load and then reverse the current (or voltage polarity) and intermittently route current from the load through the heating elements 1410*a* and/or 1410*b*, or 1420*a* and/or 1420*b*, respectively. This would enable the system to intermittently heat the sources 1310 and/or 1320 and draw current (and/or power) from sources 1310 and/or 1320. Additionally, using the switches (e.g., 105, 106, 111 and 112 in FIG. 1) of the power management systems described herein, current can be routed from one or more strings of sources (e.g., 1310 and/or 1320) through the load in one portion of a duty cycle, and current can be routed from the load through one or more heating elements (e.g., 1410*a* and/or 1410*b*, or 1420*a* and/or 1420*b*) in a second portion of the duty cycle. Switches (e.g., 105, 106, 111 and 112 in FIG. 1) of the power management systems described herein enable power to be transferred from one or more strings of sources (e.g., 1310 and/or 1320) to the load in one portion of a duty cycle, and power to be transferred from the load to one or more heating elements (e.g., 1410*a* and/or 1410*b*, or 1420*a* and/or 1420*b*) in a second portion of the duty cycle.

Subsystems 1401 and 1402 can be used to heat some of the sources coupled to the substrate 1301 and not heat others, as described above with respect to subsystem 1300 in FIG. 1. The power electronics 1340 of subsystem 1300 can also utilize calculations, simulations, weather forecasts, and/or other data to determine how to direct current (e.g., using switches 105, 106, 111 and 112 in FIG. 1), as described above with respect to subsystem 1300 in FIG. 1.

Figure 15:
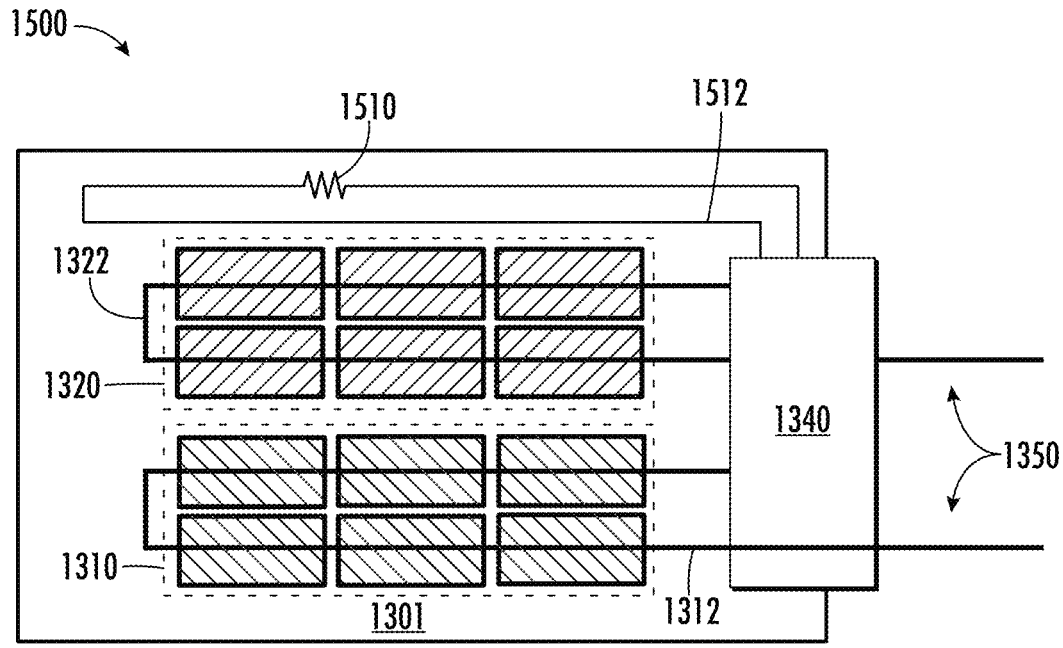
FIG. 15 shows a simplified schematic of an example of a subsystem for power management, in accordance with some embodiments.

FIG. 15 shows a simplified schematic of an example of a subsystem 1500 for power management. Subsystem 1500 is configured to route current from a load (e.g., 107 in FIG. 1) through heating element 1510, and/or transfer power from a load to heating element 1510. Some components (e.g., 1301, 1310, 1312, 1320, 1322, 1340 and 1350) of subsystem 1500 are the same as and perform the same functions as those described above with respect to subsystem 1300 in FIG. 13. The heating element 1510 of subsystem 1500 is a resistive wire, which is electrically coupled to the power electronics 1340 via an electrical connection 1512 that is separate from the electrical connections 1312 and 1322. In some cases, power electronics 1340 of subsystem 1500 contains switches (similar to switches 1230*a* or 1230*b* in FIGS. 12A and 12B, respectively) to direct the current to the sources 1310 and/or 1320 and/or to heating element 1510. The heating element 1510 can be located in any part of an apparatus or device (e.g., a solar module, or other electronic device) containing strings of sources 1310 and 1320. For example, in the case of a solar module, the heating element 1510 can be located in a frame of the module, or can be embedded in a laminate structure of the module. In another example, the heating element 1510 can be embedded in a battery and be configured to raise the temperature of one or more cells of the battery. The heating element 1500 may be configured to increase the temperature of one or more sources of strings of sources 1310 and/or 1320, a substrate coupled to the sources 1310 and 1320, and/or a housing containing sources 1310 and 1320.

Subsystem 1500 shows an example where a heating element is coupled to the power electronics 1340, and where the heating element is located on one side of substrate 1301. In other cases, there can be more than one (e.g., from 2 to 10, or 2 to 100) heating element 1510 coupled to power electronics 1340 using one or more electrical connections 1512. For example, a single heating element 1510 that is a resistive wire can traverse multiple regions of substrate 1301 (e.g., in a grid, an array of parallel lines, a diagonal pattern, or a zig-zag pattern) and be coupled to power electronics 1340 using an electrical connection 1512. For example, the heating elements, power electronics and electrical connections can be configured to selectively heat some sources of strings of sources 1310 and 1320 and not others (e.g., in a spatial pattern, or in response to additional data provided to the power electronics 1340) and/or to route current from the load through different heating elements at different times (e.g., different times within a duty cycle, or different times within a day).

Figure 16:
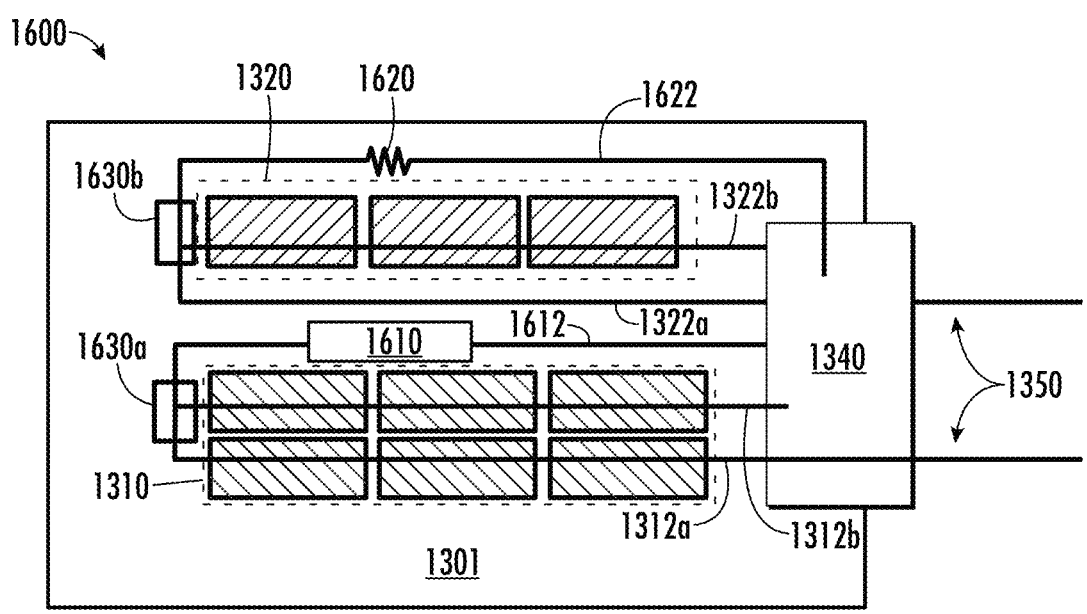
FIG. 16 shows a simplified schematic of an example of a subsystem for power management, in accordance with some embodiments.

FIG. 16 shows a simplified schematic of an example of a subsystem 1600 for power management. Subsystem 1600 is configured to route current from a load (e.g., 107 in FIG. 1) through heating element 1610 and/or 1620, and/or to transfer power from a load to heating element 1610 and/or 1620. Some components of subsystem 1600 are the same as and perform the same functions as those described above with respect to subsystem 1300 in FIG. 13. In the case shown in FIG. 16, string of sources 1310 has six sources connected in series, and string of sources 1320 has three sources connected in series. Strings of sources 1310 and 1320 are coupled to the power electronics 1340 using separate electrical connections 1312a-b and 1322a-b, respectively. Heating element 1610 is depicted as a generic heating element, and heating element 1620 is depicted as a resistive wire. In some cases, subsystem 1600 can have a different configuration of sources and heating elements.

In subsystem 1600, the heating elements 1610 and 1620 share some of the electrical connections with the strings of sources 1310 and 1320, respectively. Switches 1630a and 1630b are used to route the current through the strings of sources 1310 and/or 1320, and through heating elements 1610 and/or 1620. Switches 1630a-b may be similar to switches 1230a and/or 1230b in FIGS. 12A and 12B. The configuration of switches and electrical connections to string 1310 in subsystem 1600 additionally allows routing current through half of the cell-string 1310. This can be done by having switch 1630a connect electrical connection 1312a to electrical connection 1612 (thereby routing current through heating element 1610), but not connecting to electrical connection 1312b and therefore not routing current through the other half of string of sources 1310. By connecting the electrical connections in different combinations, some electrical connections can be used to both route current through strings of sources (e.g., 1310 and/or 1320) and through heating elements (e.g., 1610 and/or 1620).

During normal operation, subsystem 1600 may route (forward) current from string of sources 1320 through the load using electrical connections 1322a and 1322b. When the current is reversed, switch 1630b can disconnect electrical connection 1322b to protect the string of sources 1310 by preventing current from being routed through electrical connection 1322b. Switch 1630b can also connect electrical connection 1322a to electrical connection 1622 to route the reverse current from the load through the heating element 1620. In an example, the strings of sources 1310 and 1320 are solar cells (i.e., photovoltaic cells) in a solar module, and forward current is routed from the sources through the load with the solar cells operating in forward bias. When the current is reversed to transfer power to heating element 1610 and/or 1620, then switches 1630a-b may disconnect part of string 1310 and/or all of string 1320 to protect the cells from damage from the reverse current. In some cases, power can be transferred from some strings of sources, or portions of strings of sources, at the same time as current is routed from a load through one or more heating elements. Additionally, in some cases, power can be transferred from some strings of sources, or portions of strings of sources, at the same time as power is transferred from a load to one or more heating elements. This may be useful, for example in a solar module, because the non-snow covered solar cell strings may produce current (and/or power). In some cases, the electrical connections and switches can be configured such that current generated by one or more sources of the strings of sources 1310 and/or 1320 may be routed through one or more heating elements. Such a configuration can be useful, for example, in the case of a solar module, to heat the bottom portion of the module that is most likely to build up a rim of snow using current (and/or power) generated by uncovered solar cells in another region of the module.

Figure 17:
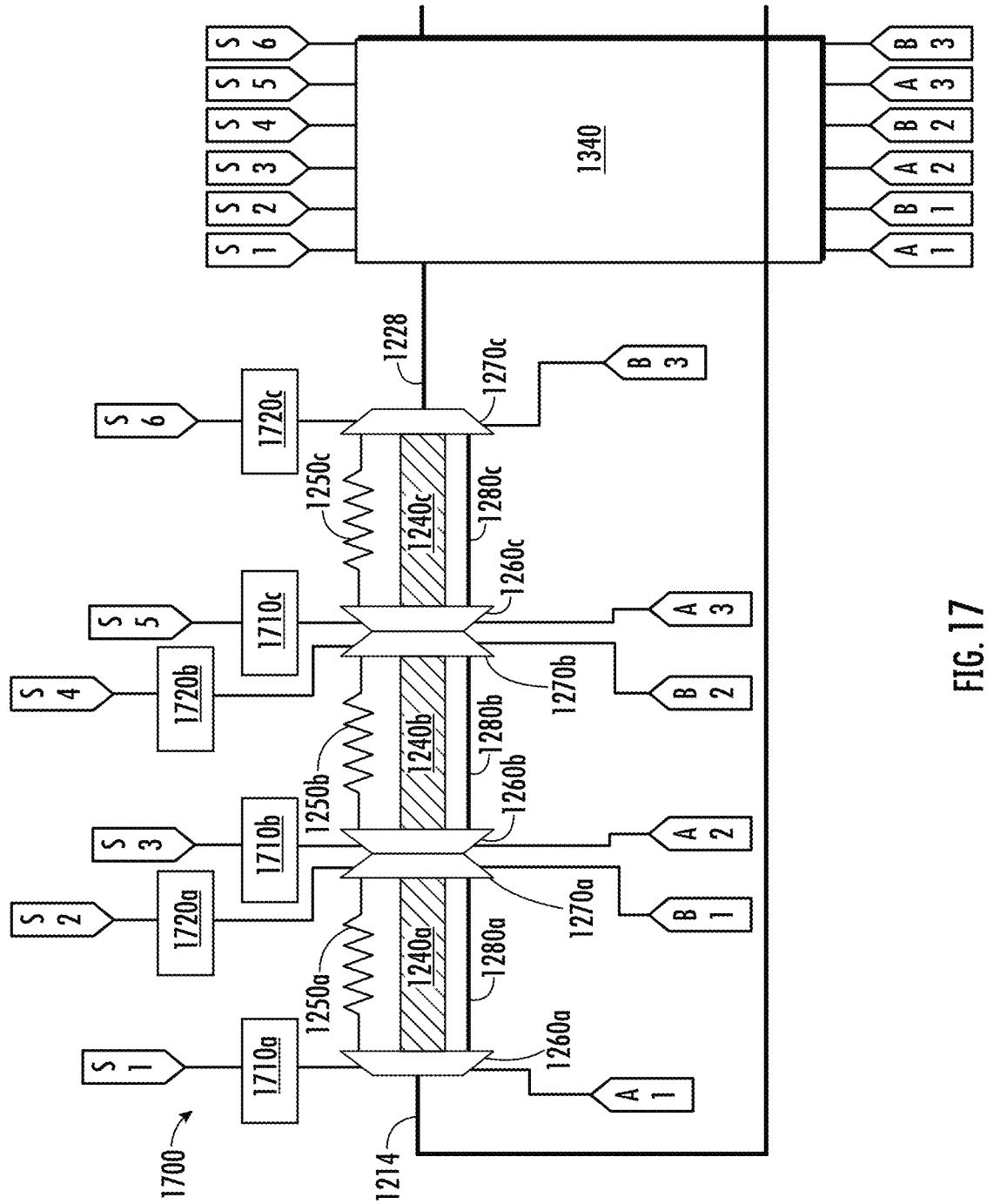
FIG. 17 shows a simplified schematic of an example of a subsystem for power management, in accordance with some embodiments.

FIG. 17 shows a simplified schematic of an example of a subsystem 1700 for power management. Subsystem 1700 is configured to route current from a load (e.g., 107 in FIG. 1) through sources 1240a-c or through heating elements 1250a-c. Subsystem 1700 is also configured to transfer power from a load to sources 1240a-c or to heating elements 1250a-c. Some components of subsystem 1700 are the same as and perform the same functions as those described above with respect to subsystem 1203 in FIG. 12C. Electrical connections 1214 and 1228 are coupled to power electronics 1340. FIG. 17 additionally includes sensors 1710a-c and 1720a-c electrically coupled to the multiplexers/demultiplexers 1260a-c and 1270a-c. The sensors can provide measurement data to the multiplexers/demultiplexers 1260a-c and 1270a-c, and the data can be used to determine where to direct current in subsystem 1700.

In some cases, the multiplexers/demultiplexers 1260a-c and 1270a-c are passive, and directly use the measurement data from sensors 1710a-c and/or 1720a-c (along with other information in some cases, e.g., the direction of the current flow) to determine where to direct current in subsystem 1700. In some cases, sensors 1710a-c and/or 1720a-c can be coupled to one or more local sensor processors (not shown), which can process data from the sensor(s) and provide processed information to the multiplexers/demultiplexers 1260a-c and 1270a-c to direct the current.

In some cases, the multiplexers/demultiplexers 1260a-c and 1270a-c are actively controlled by power electronics (e.g., 1340 in FIG. 13). In such active cases, multiplexers/demultiplexers 1260a-c and 1270a-c are electrically coupled to the power electronics 1340 through electrical connections A1-A3 and B1-B3. In some cases, sensors 1710a-c and 1720a-c can be electrically coupled to the power electronics through electrical connections S1-S6 (either in addition to, or instead of being coupled to the multiplexers/demultiplexers as shown in subsystem 1700). The power electronics 1340 can then use the measurement data provided by sensors 1710a-c and 1720a-c to control the multiplexers/demultiplexers 1260a-c and 1270a-c to direct current in subsystem 1700. In such cases, the electrical connections between sensors 1710a-c and 1720a-c can be omitted, since the sensors 1710a-c and 1720a-c provide data to the power electronics 1340 (through electrical connections S1-S6) and the power electronics 1340 control the multiplexers/demultiplexers 1260a-c and 1270a-c (through electrical connections A1-A3 and B1-B3). In some cases, sensors 1710a-c and/or 1720a-c can be coupled to one or more local sensor processors (not shown), which can process data from the sensor(s) and provide processed information to the power electronics 1340.

The sensors coupled to demultiplexers may provide data that is used by the demultiplexers to determine how current is directed to sources 1240a-c, heating elements 1250a-c, and/or a bypass connections 1280a-c. Which elements 1260a-c or 1270a-c are demultiplexers will depend on the direction of the current flow, as described above. Subsystem 1700 is able to direct forward or reverse current to a heating element 1250a-c, and this enables current from the sources 1240a-c to also be collected in the forward or reverse direction while current is directed to a heating element 1250a-c. This is beneficial, for example, in the case of a solar module, since current can be routed from one or more of sources 1240a-c through a load while current is simultaneously routed through one or more heating elements 1250a-c. The configuration of the multiplexers/demultiplexers 1260a-c and 1270a-c in subsystem 1700 allows current to be routed from a source (e.g., 1240a) through a load and for current to be routed through a heating element (e.g., 1250a) simultaneously, even though the source (e.g., 1240a) and the heating element (e.g., 1250a) are electrically connected in parallel (e.g., between a multiplexer/demultiplexer pair).

In some cases, sensors 1710a-c and 1720a-c are temperature sensors configured to measure a temperature within an apparatus or device containing the sources 1240a-c. Temperature sensors 1710a-c and 1720a-c can measure a temperature adjacent to a source, near a source, or at any location within an apparatus or device containing the sources 1240a-c. The sensor elements 1710a-c and 1720a-c can be coupled to a demultiplexer (e.g., one of 1710a-c or 1720a-c) or a switch that can protect one or more of the sources by directing current away from the one or more sources in response to a sensor measuring a temperature greater than a threshold temperature. In some cases, the demultiplexers 1710a-c or 1720a-c (or switches) can disconnect (i.e., not direct current through) a source 1240a-c in response to the sensor measuring a temperature greater than a threshold temperature automatically (or passively), without requiring sending a signal from the temperature sensor to the power electronics and/or to a sensor processor. In other cases, data can be sent from one or more temperature sensors to a sensor processor and/or to power electronics 1340 (through electrical connections S1-S6) and the sensor processor and/or the power electronics 1340 can control the demultiplexer(s) 1710a-c or 1720a-c to direct current in subsystem 1700 in response to the sensor measuring a temperature greater than a threshold temperature. Distributing sensor elements (e.g., either passive sensor elements, or sensor elements containing sensor processors) throughout subsystem 1700 can be advantageous to reduce the processing power required from the power electronics 1340, and/or to ensure that no software changes could allow dangerous heating conditions. For example, in the case of a solar module, sensors 1710a-c and 1720a-c can indicate which cells (1240a-c) within the solar module may have temperatures above a threshold temperature and in response the subsystem can stop heating that source 1240a-c (or stop sending current to a heating element 1250a-c that heats that source 1240a-c). In another example, in the case of a battery, sensors 1710a-c and 1720a-c can indicate which battery cells (1240a-c) may have temperatures below a threshold temperature and in response can route current through heating element 1250a-c that heats that source 1240a-c (e.g., to improve the efficiency of the battery 1240a-c).

In some cases, the sensors 1710a-c and 1720a-c are photodiodes that detect light intensity within an apparatus or device containing the sources 1240a-c. Similar to or in conjunction with temperature sensors described above, data from photodiodes can be used to control the demultiplexers of subsystem 1700. For example, in the case of a solar module, a photodiode can indicate which portions of the solar module are shaded (e.g., due to being covered with snow) and which portions are not. Other types of sensors, such as those detecting vibration, patterns of vibration (e.g., due to resonant wind speed), tilt, radio frequency signals (RF), and/or power conditions (e.g., those that indicate damage to one or more sources), could also be used to detect different conditions within an apparatus or device containing the sources 1240a-c, and measurement data from the sensors can be used to direct the current in subsystem 1700.

Subsystem 1700 shows an example where measurement data from a sensor or multiple sensors can be used to direct current in the subsystem 1700. In other examples, there may be more or fewer sensors. For example, a sensor may be located adjacent to several sources and provide data about a group of sources. Sources 1240a-c can also represent groups (or strings) of sources, as described above, and groups (or strings) of sources can be protected using a multiplexer/demultiplexer pair and one or more sensors that provide data local to the group of sources.

Figure 18:
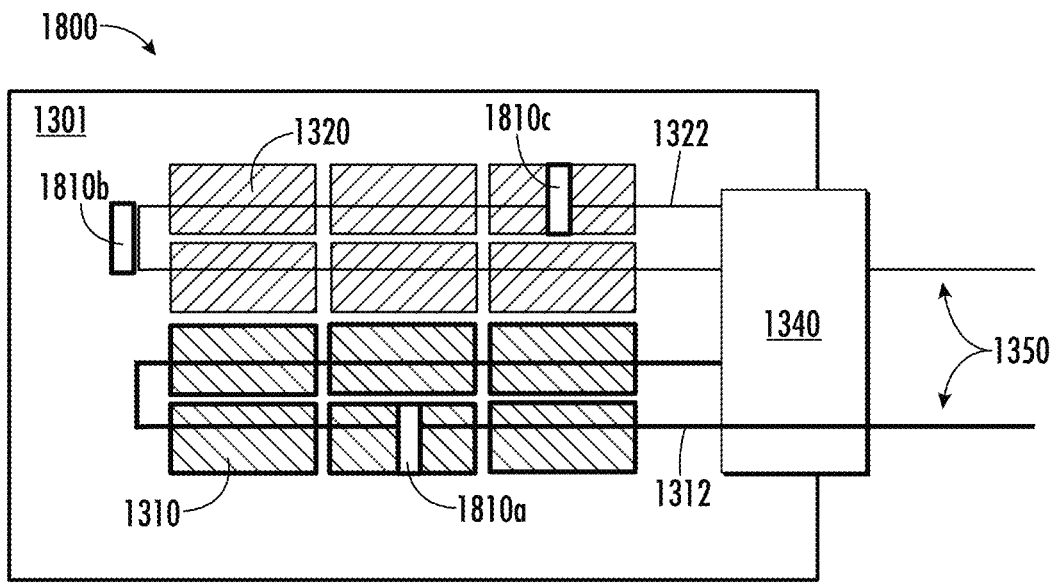
FIG. 18 shows a simplified schematic of an example of a subsystem for power management, in accordance with some embodiments.

FIG. 18 shows a simplified schematic of an example of a subsystem 1800 for power management. Subsystem 1800 is configured to route current from a load (e.g., 107 in FIG. 1) through strings of sources 1310 and/or 1320, and/or to transfer power from a load to strings of sources 1310 and/or 1320. Some components of subsystem 1800 are the same as and perform the same functions as those described above with respect to subsystem 1300 in FIG. 13. Subsystem 1800 also includes sensors 1810a-c configured to measure one or more properties of subsystem 1800, such as temperature, vibration, patterns of vibration (e.g., due to resonant wind speed), tilt, radio frequency signals (RF), power conditions (e.g., those that indicate damage to one or more sources), and irradiance level. The sensors 1810a-c can be coupled to the power electronics 1340 and the power electronics 1340 can use measurement data from the sensors to control the subsystem 1800. For example, power electronics 1340 can use date from one or more of sensors 1810a-c to determine when to send power from a string of sources 1310 and/or 1320 to a load (not shown), and when to send power from the load to string of sources 1310 and/or 1320.

Subsystem 1800 includes two sensors 1810a and 1810c adjacent to (or near) sources of strings of sources 1310 and 1320 and sensor 1810b adjacent to (or near) electrical connection 1322. In some cases, there can be more or fewer sensors (e.g., from 1 to 10, or from 1 to 100) within an apparatus or device containing strings of sources 1310 and 1320, and the sensors can be placed in any location within the apparatus or device to measure one or more properties (e.g., temperature, vibration) of the apparatus or device. For example, in the case where strings of sources 1310 and 1320 are strings of solar cells within a solar module, sensors can be placed adjacent to a cell (or some of the cells, or all of the cells) to measure the local temperature(s) of the cell(s) and that data can be used by power electronics 1340 to determine when to send power from a load to one or more cells. In another example, in the case where strings of sources 1310 and 1320 are strings of solar cells within a solar module, sensors can be placed in the module to detect a magnitude of vibration of the module (which can be an indicator of wind conditions).

Figure 19:
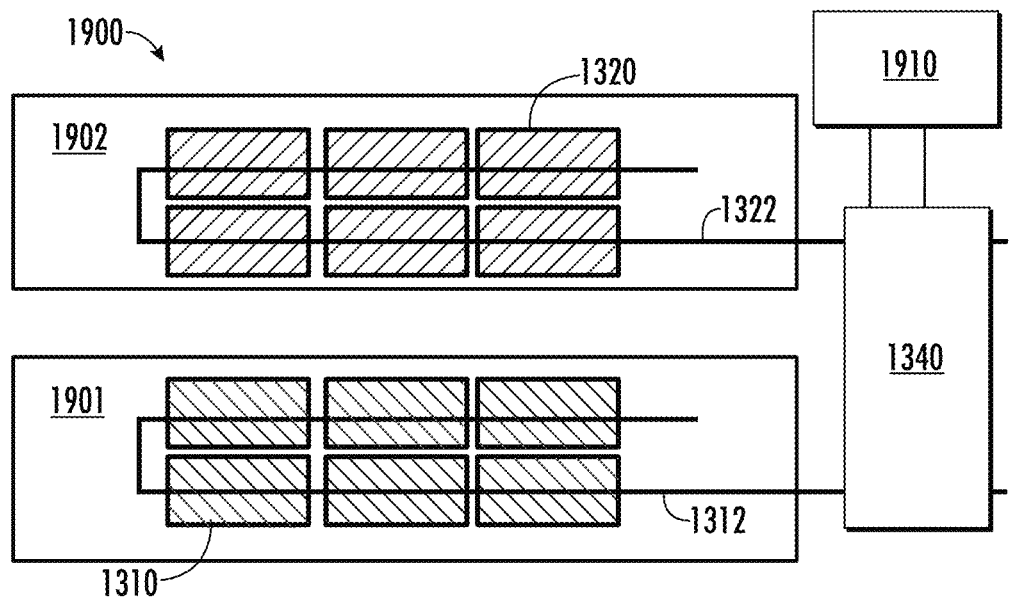
FIG. 19 shows a simplified schematic of an example of a subsystem for power management, in accordance with some embodiments.

FIG. 19 shows a simplified schematic of an example of a subsystem 1900 for power management. Subsystem 1900 is configured to route current from a load (e.g., 107 in FIG. 1) through strings of sources 1310 and/or 1320, and/or to transfer power from a load to strings of sources 1310 and/or 1320. Some components of subsystem 1900 are the same as and perform the same functions as those described above with respect to subsystem 1300 in FIG. 13. Subsystem 1900 includes separate substrates 1901 and 1902 for strings of sources 1310 and 1320, respectively. The substrates 1901 and 1902 can be housed within one apparatus or device, or can be portions of separate apparatuses or devices. The strings of sources 1310 and 1320 are each coupled to power electronics 1340 using electrical connections 1312 and 1322.

Subsystem 1900 utilizes one power electronics 1340 to control strings of sources 1310 and 1320, and therefore shows an example where different apparatuses or devices can be controlled using a single power electronics 1340. Subsystem 1900 shows one power electronics 1340 coupled to two string of sources, each on their own substrate. In some cases, a single power electronics 1340 can control more than two strings of sources (e.g., from 3 to 10, or from 10 to 100, or more than 100). In some cases, one or more strings of sources can be coupled to a first substrate, one or more strings of sources can be coupled to a second substrate, and a power electronics 1340 can control the strings of substrates coupled to the first and second substrates. In some cases, a subsystem similar to 1900 can include more than one power electronics 1340, and each power electronics 1340 can control one or more strings of sources (optionally coupled to more than one substrate).

Subsystem 1900 also includes a module 1910 that is separate from the apparatus(es) or device(s) coupled to and/or containing sources 1310 and 1320. Power electronics 1340 can route current (and/or power) through module 1910, for example, to heat a heating element within module 1910. For example, module 1910 can be a housing (or compartment) of a battery and power electronics 1340 can route current through one or more heating elements within module 1910 to increase the battery temperature above a certain threshold, or maintain the battery at a certain temperature. In another example, module 1910 can be an auxiliary system for a solar module, or array of solar modules, that can benefit from current being routed through module 1910. In such cases, module 1910 may contain electronics (e.g., inverters, batteries, environmental monitoring equipment), or a moving system (e.g., to move one or more solar modules, or to move a component to cover or uncover a solar module), that require current (and/or power) and/or that benefit(s) from module 1910 maintaining a certain temperature.

Figure 20:
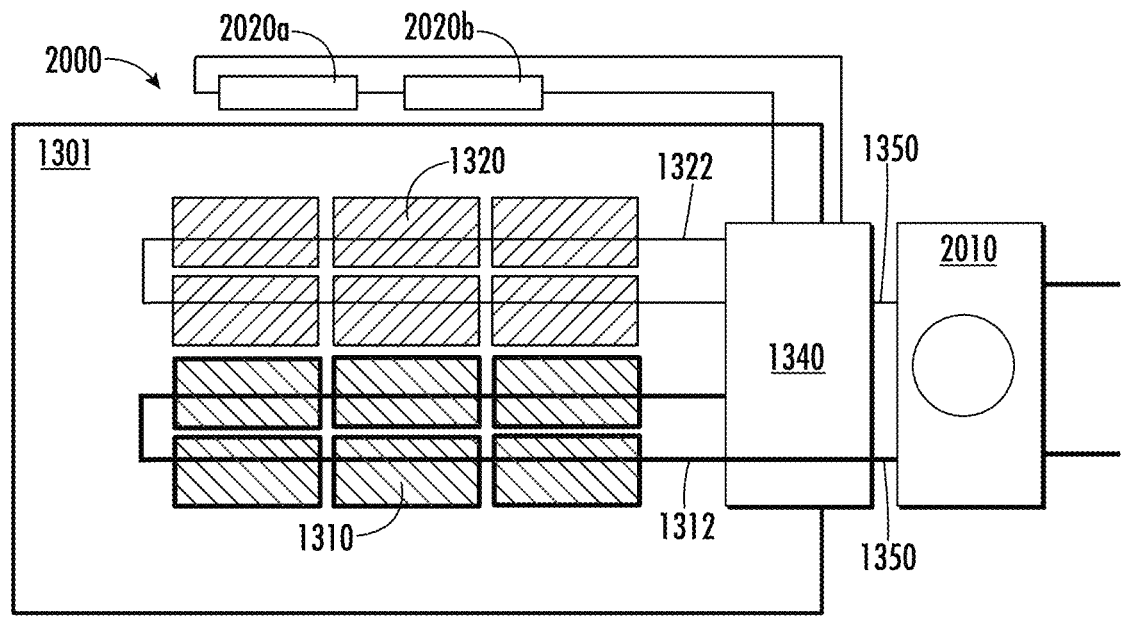
FIG. 20 shows a simplified schematic of an example of a subsystem for power management, in accordance with some embodiments.

FIG. 20 shows a simplified schematic of an example of a subsystem 2000 for power management. Subsystem 2000 is configured to route current from a load (e.g., 107 in FIG. 1) through strings of sources 1310 and/or 1320, and/or to transfer power from a load to strings of sources 1310 and/or 1320. Some components of subsystem 2000 are the same as and perform the same functions as those described above with respect to subsystem 1300 in FIG. 13. Subsystem 2000 also includes a rapid shutdown switch 2010 coupled to the power electronics 1340 using electrical connections 1350. Subsystem 2000 can send power from a string of sources 1310 and/or 1320 to load (not shown), and can send power from the load to a string of sources 1310 and/or 1320, as described herein. In addition, the power electronics 1340 are configured to change the power conditions or disconnect the strings of sources 1310 and 1320 in response to actuation of the rapid shutdown switch 2010, thereby limiting the delivery of power to the load from a string of sources 1310 and/or 1320, and also limiting the delivery of power from the load to the string of sources 1310 and/or 1320. In some cases, a subsystem similar to subsystem 2000 can also contain heating elements 2020a and 2020b (and/or can contain other heating elements, e.g., as described with respect to FIGS. 12A-12C, 14A-14B, and 15-17) and the rapid shutdown switch 2010 can also limit the delivery of power from the load to heating elements in response to actuation of the rapid shutdown switch 2010.

Figure 21:
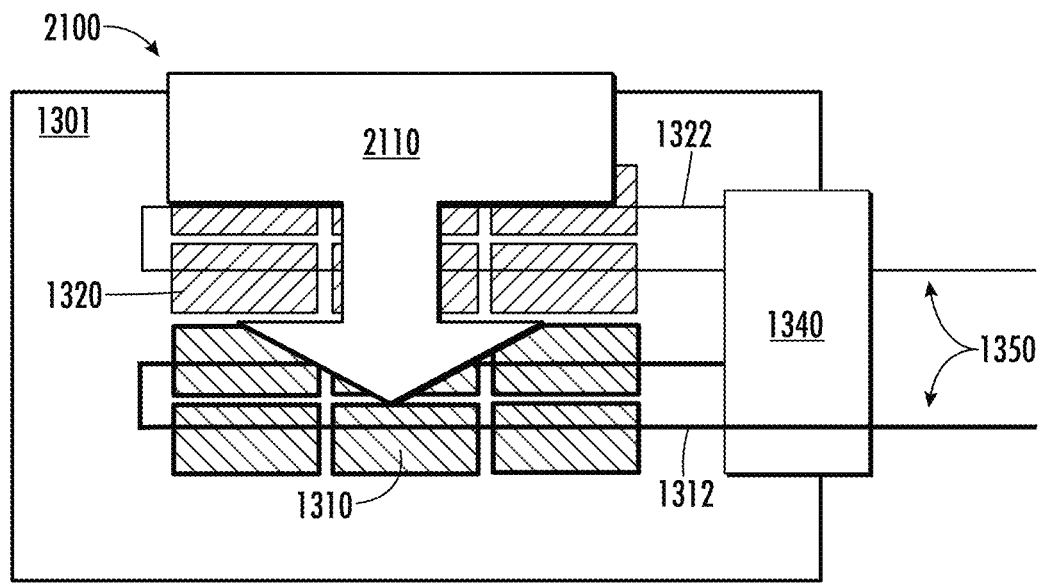
FIG. 21 shows a simplified schematic of an example of a subsystem for power management, in accordance with some embodiments.

FIG. 21 shows a simplified schematic of an example of a subsystem 2100 for power management. Subsystem 2100 is configured to route current from a load (e.g., 107 in FIG. 1) through strings of sources 1310 and/or 1320, and/or to transfer power from a load to strings of sources 1310 and/or 1320. Some components of subsystem 2100 are the same as and perform the same functions as those described above with respect to subsystem 1300 in FIG. 13. Subsystem 2100 also includes a physical actuator 2110. Physical actuator 2110 can be a wiper configured to clean the surface of an apparatus or device containing strings of sources 1310 and 1320. Physical actuator 2110 can also be a vibration generation unit configured to vibrate an apparatus or device containing strings of sources 1310 and 1320 to dislodge material on the apparatus or device. For example, in the case where strings of sources 1310 and 1320 are strings of solar cells in a solar module, physical actuator 2110 can be a piezo electric vibration unit, a vibration unit using electromagnetic switching states, or a wiper used to dislodge (or push) partially melted snow off of the solar module (e.g., where the snow has been melted using current from a load to sources or heating elements, as described herein).

FIGS. 12A-21 show simplified schematics of examples of systems for power management, and many variations in numbers of sources, numbers of heating elements, electrical connections, and spatial arrangement of sources and heating elements are possible within the scope of the present systems and methods.

The power electronics can control the subsystems shown in FIGS. 12A-21 to heat one or more sources and/or one or more heating elements using the systems described herein (e.g., system 100 in FIG. 1) by intermittently sending current (and/or power) from the sources 1310 and/or 1320 to a load, and intermittently reversing the current (or voltage polarity) and sending current (and/or power) from the load to the heating element 1510.

The power electronics can control the subsystems shown in FIGS. 12A-21 to heat some of the sources of an apparatus or device and not heat others, for example, as described above with respect to subsystem 1300 in FIG. 13.

The power electronics can also control the subsystems shown in FIGS. 12A-21 by utilizing calculations, simulations, weather forecasts, and/or other data to determine how to direct current (e.g., using switches 105, 106, 111 and 112 in FIG. 1), for example, as described above with respect to subsystem 1300 in FIG. 1. The power electronics of FIGS. 12A-21 can also receive measurements from sensors, and the measurements from sensors can be used as inputs to the calculations used to control the subsystems shown in FIGS. 12A-21. The following examples are put forth so as to provide those of ordinary skill in the art with a complete disclosure and description of how the compounds, compositions, articles, devices and/or methods claimed herein are made and evaluated, and are intended to be purely exemplary and are not intended to limit the scope of the methods and systems. Efforts have been made to ensure accuracy with respect to numbers (e.g., amounts, temperature, etc.), but some errors and deviations should be accounted for. Unless indicated otherwise, parts are parts by weight, temperature is in ° C. or is at ambient temperature, and pressure is at or near atmospheric.

Embodiment 1: A method comprising: transferring, for each phase of a multiphase cycle, power from a different source of a plurality of sources to a load, determining, for each phase of the multiphase cycle, an input voltage associated with the transferred power, an output voltage associated with the transferred power, and current from the source associated with the transferred power, determining a duty cycle associated with the source, modifying, based on the input voltage associated with the transferred power, one or more of the output voltage associated with the transferred power, the current from the source, or the duty cycle associated with the source, wherein the modified duty cycle comprises an increase or a decrease in the duty cycle associated with the source based on one or more of the input voltage not satisfying an input voltage level threshold, the output voltage satisfying an output voltage level threshold, or the current from the source exceeding a current level threshold, and modifying, based on the modified duty cycle, timing for each phase of the multiphase cycle.

Embodiment 2: The embodiment as in any one of the preceding embodiments wherein modifying the timing for each phase of the multiphase cycle comprises delaying, based on the conductive state of the respective source to the load, each phase of the multiphase cycle so that each of the transition times between each phase of the multiphase cycle are equivalent.

Embodiment 3: The embodiment as in any one of the preceding embodiments, wherein the plurality of sources comprise one or more photovoltaic cells of a photovoltaic cell-string, one or more cells of a multi-cell battery, one or more energy storing current sources, one or more thermoelectric device, or one or more energy-harvesting devices, or one-or-more electrodes harvesting energy individually from a non-discrete power source.

Embodiment 4: The embodiment as in any one of the preceding embodiments, wherein the load comprises one or more electro-physical stimulation devices associated with an organic organism.

Embodiment 5: The embodiment as in any one of the preceding embodiments wherein each phase of the multiphase cycle is associated with a direct current-to-direct current (DC-DC) boost converter.

Embodiment 6: The embodiment as in embodiment 1, wherein, wherein modifying the timing for each phase of the multiphase cycle causes, based on a phase skipping control algorithm, power to not transfer to the load for at least one phase of the multiphase cycle.

Embodiment 7: A method comprising: determining, for each phase of a multiphase cycle, one or more parameter values associated with output power, modifying, based on the one or more parameter values, the duty cycle of a synchronization switching component associated with the phase, and causing, based on the modified duty cycle for each phase of the multiphase cycle, an equivalent transition time between each phase of the multiphase cycle.

Embodiment 8: The embodiment of embodiment 7 wherein causing the equivalent transition time between each phase of the multiphase cycle comprises modifying the phase timing for each phase of the multiphase cycle based on the center on a synchronization signal associated with each phase of the multiphase cycle.

Embodiment 9: A method comprising: transferring, for each phase of a multiphase cycle, power from a different source of a plurality of sources to a load, determining, for each phase of the multiphase cycle, based on an input voltage associated with source and current drawn from the source, an amount of power transferred from the source to the load, and modifying, based on the amount of power transferred from the source to the load, current drawn from the source.

Embodiment 10: The embodiment of embodiment 9 wherein modifying the current drawn from the source comprises causing, based on determining that the amount of power transferred from the source to the load does not satisfy a threshold, an increase or a decrease in the current drawn from the source.

Embodiment 11: The embodiment of embodiment 9 or embodiment 10, further comprising sending current from the load to the source.

While the methods and systems have been described in connection with preferred embodiments and specific examples, it is not intended that the scope be limited to the particular embodiments set forth, as the embodiments herein are intended in all respects to be illustrative rather than restrictive.

Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is in no way intended that an order be inferred, in any respect. This holds for any possible non-express basis for interpretation, including: matters of logic with respect to arrangement of steps or operational flow; plain meaning derived from grammatical organization or punctuation; the number or type of embodiments described in the specification.

It will be apparent to those skilled in the art that various modifications and variations can be made without departing from the scope or spirit. Other embodiments will be apparent to those skilled in the art from consideration of the specification and practice disclosed herein. It is intended that the specification and examples be considered as exemplary only, with a true scope and spirit being indicated by the following claims.

It is to be understood that the present methods and systems disclosed and described herein are not limited to specific methods, specific components, or to particular implementations. It is also to be understood that the terminology used herein is for the purpose of describing particular embodiments only and is not intended to be limiting.

As used in the specification and the appended claims, the singular forms "a," "an," and "the" include plural referents unless the context clearly dictates otherwise. Ranges may be expressed herein as from "about" one particular value, and/or to "about" another particular value. When such a range is expressed, another embodiment includes from the one particular value and/or to the other particular value. Similarly, when values are expressed as approximations, by use of the antecedent "about," it will be understood that the particular value forms another embodiment. It will be further understood that the endpoints of each of the ranges are significant both in relation to the other endpoint, and independently of the other endpoint.

"Optional" or "optionally" means that the subsequently described event or circumstance may or may not occur, and that the description includes instances where said event or circumstance occurs and instances where it does not.

Throughout the description and claims of this specification, the word "comprise" and variations of the word, such as "comprising" and "comprises," means "including but not limited to," and is not intended to exclude, for example, other components, integers or steps. "Exemplary" means "an example of" and is not intended to convey an indication of a preferred or ideal embodiment. "Such as" is not used in a restrictive sense, but for explanatory purposes.

Disclosed are components that can be used to perform the disclosed methods and systems. These and other components are disclosed herein, and it is understood that when combinations, subsets, interactions, groups, etc. of these components are disclosed that while specific reference of each various individual and collective combinations and permutation of these may not be explicitly disclosed, each is specifically contemplated and described herein, for all methods and systems. This applies to all aspects of this application including, but not limited to, steps in disclosed methods. Thus, if there are a variety of additional steps that can be performed it is understood that each of these additional steps can be performed with any specific embodiment or combination of embodiments of the disclosed methods.

The present methods and systems may be understood more readily by reference to the detailed description of preferred embodiments and the examples included therein and to the Figures and their previous and following description.

As will be appreciated by one skilled in the art, the methods and systems may take the form of an entirely hardware embodiment, an entirely software embodiment, or an embodiment combining software and hardware aspects. Furthermore, the methods and systems may take the form of a computer program product on a computer-readable storage medium having computer-readable program instructions (e.g., computer software) embodied in the storage medium. More particularly, the present methods and systems may take the form of web-implemented computer software. Any suitable computer-readable storage medium may be utilized including hard disks, CD-ROMs, optical storage devices, or magnetic storage devices.

Embodiments of the methods and systems are described herein with reference to block diagrams and flowchart illustrations of methods, systems, apparatuses and computer program products. It will be understood that each block of the block diagrams and flowchart illustrations, and combinations of blocks in the block diagrams and flowchart illustrations, respectively, can be implemented by computer program instructions. These computer program instructions may be loaded onto a general purpose computer, special purpose computer, or other programmable data processing apparatus to produce a machine, such that the instructions which execute on the computer or other programmable data processing apparatus create a means for implementing the functions specified in the flowchart block or blocks.

These computer program instructions may also be stored in a computer-readable memory that can direct a computer or other programmable data processing apparatus to function in a particular manner, such that the instructions stored in the computer-readable memory produce an article of manufacture including computer-readable instructions for implementing the function specified in the flowchart block or blocks. The computer program instructions may also be loaded onto a computer or other programmable data processing apparatus to cause operational steps to be performed on the computer or other programmable apparatus to produce a computer-implemented process such that the instructions that execute on the computer or other programmable apparatus provide steps for implementing the functions specified in the flowchart block or blocks.

Accordingly, blocks of the block diagrams and flowchart illustrations support combinations of means for performing the specified functions, combinations of steps for performing the specified functions and program instruction means for performing the specified functions. It will also be understood that each block of the block diagrams and flowchart illustrations, and combinations of blocks in the block diagrams and flowchart illustrations, can be implemented by special purpose hardware-based computer systems that perform the specified functions or steps, or combinations of special purpose hardware and computer instructions.

Note that in various instances this detailed disclosure may refer to a given entity performing some action. It should be understood that this language may in some cases mean that a system (e.g., a computer) owned and/or controlled by the given entity is actually performing the action.

What is claimed is:

1. An apparatus comprising:
a plurality of power sources;
one or more processors embedded with the plurality of power sources; and
memory storing processor executable instructions that, when executed by the one or more processors, cause the apparatus to:
transfer, for each phase of a multiphase cycle, power from a power source of the plurality of power sources to a load;
determine, for each phase of the multiphase cycle, an input voltage associated with the transferred power, an output voltage associated with the transferred power, and current from the power source associated with the transferred power;
determine, for each power source of the plurality of power sources, a duty cycle associated with the power source;
modify, based on the input voltage associated with the transferred power for each phase of the multiphase cycle, the output voltage associated with the transferred power for each phase of the multiphase cycle, and the current from the power source associated with the transferred power for each phase of the multiphase cycle, the duty cycle associated with each power source of the plurality of power sources,
wherein, for each power source of the plurality of power sources, the modified duty cycle comprises an increase or a decrease in the duty cycle based on one or more of the input voltage not satisfying an input voltage level threshold, the output voltage satisfying an output voltage level threshold, or the current from the power source exceeding a current level threshold; and
modify, based on the modified duty cycle, timing for each phase of the multiphase cycle.

2. The apparatus of claim 1, wherein the processor executable instructions that, when executed by the one or more processors, cause the apparatus to modify the timing for each phase of the multiphase cycle further cause the apparatus to delay, based on a conductive state of the respective power source to the load, each phase of the multiphase cycle so that each transition time between each phase of the multiphase cycle is equivalent.

3. The apparatus of claim 1, wherein the plurality of power sources comprises one or more photovoltaic cells of a photovoltaic cell-string, one or more photovoltaic cells of a photovoltaic module, one or more cells of a multi-cell battery, one or more energy storing current sources, one or more thermoelectric devices, or one or more energy-harvesting devices.

4. The apparatus of claim 1, wherein the load comprises one or more electro-physical stimulation devices associated with an organic organism, or an energy-harvesting device associated with an organic organism or an organic material.

5. The apparatus of claim 1, further comprising a plurality of power converters, wherein each phase of the multiphase cycle is associated with a power converter of the plurality of power converters.

6. The apparatus of claim 1, wherein each phase of the multiphase cycle is associated with a direct current-to-direct current (DC-DC) boost converter.

7. The apparatus of claim 1, wherein modifying the timing for each phase of the multiphase cycle causes, based on a phase skipping control algorithm, power to not transfer to the load for at least one phase of the multiphase cycle.

8. The apparatus of claim 1, wherein the processor executable instructions that, when executed by the one or more processors, cause the apparatus to modify the timing for each phase of the multiphase cycle further cause the apparatus to cause, based on a phase skipping control algorithm, power to not transfer to the load for at least one phase of the multiphase cycle.

9. The apparatus of claim 1, wherein the processor executable instructions, when executed by the one or more processors, further cause the apparatus to transfer power from the load to a power source of the plurality of power sources.

10. The apparatus of claim 9, further comprising a sensor, wherein the sensor is coupled to a switch, a multiplexer and a demultiplexer, or a sensor processor, and wherein the switch, the demultiplexer, or the sensor processor is configured to direct current away from a power source of the plurality of power sources.

11. The apparatus of claim 9, wherein the plurality of power sources comprises a plurality of solar cells.

12. The apparatus of claim 1, wherein the processor executable instructions, when executed by the one or more processors, further cause the apparatus to transfer power from a power source of the plurality of power sources to the load for a first phase of the multiphase cycle and to transfer power from the load to a power source of the plurality of power sources for a second phase of the multiphase cycle.

13. The apparatus of claim 1, further comprising a heating element, wherein the heating element is configured to increase a temperature of the apparatus, and wherein the processor executable instructions, when executed by the one or more processors, further cause the apparatus to transfer power from the load to the heating element.

14. The apparatus of claim 13, wherein the heating element is a resistive wire embedded in the apparatus with the plurality of power sources.

15. The apparatus of claim 13, wherein the heating element is a heating unit embedded in the apparatus with the plurality of power sources or coupled to the apparatus.

16. The apparatus of claim 13, wherein the plurality of power sources comprises a plurality of solar cells.

17. The apparatus of claim 1, further comprising a heating element, wherein the processor executable instructions, when executed by the one or more processors, further cause the apparatus to transfer power from a power source of the plurality of power sources to the load for a first phase of the multiphase cycle and to transfer power from the load to the heating element for a second phase of the multiphase cycle.

18. An apparatus, comprising:
non-transitory computer readable medium, configured to store information; and
a processor, coupled to the non-transitory computer readable medium, configured to cause the apparatus to:
transfer, for each phase of a multiphase cycle, power from a different power source of a plurality of power sources to a load;
determine, for each phase of the multiphase cycle, an input voltage associated with the transferred power, an output voltage associated with the transferred power, and current from the power source associated with the transferred power;
determine, for each power source of the plurality of power sources, a duty cycle associated with the power source;
modify, based on the input voltage associated with the transferred power for each phase of the multiphase cycle, the output voltage associated with the transferred power for each phase of the multiphase cycle, and the current from the power source associated with the transferred power for each phase of the multiphase cycle, the duty cycle associated with each power source of the plurality of power sources:
wherein, for each power source of the plurality of power sources, the modified duty cycle comprises an increase or a decrease in the duty cycle based on one or more of the input voltage not satisfying an input voltage level threshold, the output voltage satisfying an output voltage level threshold, or the current from the power source exceeding a current level threshold; and
modify, based on the modified duty cycle, timing for each phase of the multiphase cycle.

19. The apparatus of claim 18, wherein the processor, coupled to the non-transitory computer readable medium, configured to modify the timing for each phase of the multiphase cycle is further configured to delay, based on a conductive state of the respective power source to the load, each phase of the multiphase cycle so that each transition time between each phase of the multiphase cycle is equivalent.

20. The apparatus of claim 18, wherein the plurality of power sources comprises one or more photovoltaic cells of a photovoltaic cell-string, one or more photovoltaic cells of a photovoltaic module, one or more cells of a multi-cell battery, one or more energy storing current sources, one or more thermoelectric devices, or one or more energy-harvesting devices.

21. The apparatus of claim 18, wherein the load comprises one or more electro-physical stimulation devices associated with an organic organism, or an energy-harvesting device associated with an organic organism or an organic material.

22. The apparatus of claim 18, wherein each phase of the multiphase cycle is associated with a power converter of a plurality of power converters.

23. The apparatus of claim 18, wherein each phase of the multiphase cycle is associated with a direct current-to-direct current (DC-DC) boost converter.

24. The apparatus of claim 18, wherein modifying the timing for each phase of the multiphase cycle causes, based on a phase skipping control algorithm, power to not transfer to the load for at least one phase of the multiphase cycle.

25. The apparatus of claim 18, wherein processor executable instructions stored on the non-transitory computer readable medium that, when executed by the one or more processors, cause the apparatus to modify the timing for each phase of the multiphase cycle further cause the apparatus to cause, based on a phase skipping control algorithm, power to not transfer to the load for at least one phase of the multiphase cycle.

26. The apparatus of claim 18, wherein the processor is further configured to cause the apparatus to transfer power from the load to a power source of the plurality of power sources.

27. The apparatus of claim 18, wherein the processor is further configured to cause the apparatus to transfer power from a power source of the plurality of power sources to the load for a first phase of the multiphase cycle and to transfer power from the load to a power source of the plurality of power sources for a second phase of the multiphase cycle.

28. The apparatus of claim 18, wherein the processor is further configured to cause the apparatus to transfer power from the load to a heating element.

29. The apparatus of claim 18, wherein the processor is further configured to cause the apparatus to transfer power from a power source of the plurality of power sources to the load for a first phase of the multiphase cycle and to transfer power from the load to a heating element for a second phase of the multiphase cycle.

30. An apparatus comprising:
one or more processors embedded with a plurality of power sources; and
memory storing processor executable instructions that, when executed by the one or more processors, cause the apparatus to:
transfer, for each phase of a multiphase cycle, power from a different power source of the plurality of power sources to a load;
determine, for each phase of the multiphase cycle and for each different power source of the plurality of power sources, based on an input voltage associated with each of the different power sources and current drawn from each of the different power sources, an amount of power transferred from each of the different power sources to the load; and
modify, based on the amount of power transferred from each different power source of the plurality of power sources to the load, the current drawn from each of the different power sources.

31. The apparatus of claim 30, wherein the processor executable instructions that, when executed by the one or more processors, cause the apparatus to modify the current drawn from each different power source of the plurality of power sources further cause the apparatus to cause, based on the amount of power transferred from the each different power source of the plurality of power sources to the load not satisfying a threshold, an increase or a decrease in the current drawn from the plurality of power sources.

32. The apparatus of claim 30, wherein the memory storing processor executable instructions that, when executed by the one or more processors, further cause the apparatus to cause, based on the modified duty cycle for each phase of the multiphase cycle, an equivalent transition time between each phase of the multiphase cycle.

33. The apparatus of claim 30, wherein the processor executable instructions, when executed by the one or more processors, further cause the apparatus to route a second current from the load through the plurality of power sources.

34. The apparatus of claim 30, wherein the processor executable instructions, when executed by the one or more processors, further cause the apparatus to transfer power from the load to a power source of the plurality of power sources.

35. The apparatus of claim 34, further comprising a sensor, wherein the sensor is coupled to a switch, a demultiplexer, or a sensor processor, and wherein the switch, the demultiplexer, or the sensor processor is configured to direct current away from a power source of the plurality of power sources.

36. The apparatus of claim 34, wherein the plurality of power sources comprises a plurality of solar cells.

37. The apparatus of claim 30, wherein the processor executable instructions, when executed by the one or more processors, further cause the apparatus to transfer power from a power source of the plurality of power sources to the load for a first phase of the multiphase cycle and to transfer power from the load to the power source of the plurality of power sources for a second phase of the multiphase cycle.

38. The apparatus of claim 30, further comprising a heating element, wherein the heating element is configured to increase a temperature of the apparatus, and wherein the processor executable instructions, when executed by the one or more processors, further cause the apparatus to transfer power from the load to the heating element.

39. The apparatus of claim 38, wherein the heating element is a resistive wire embedded in the apparatus with the plurality of power sources.

40. The apparatus of claim 38, wherein the heating element is a heating unit embedded in the apparatus with the plurality of power sources or coupled to the apparatus.

41. The apparatus of claim 38, wherein the plurality of power sources comprises a plurality of solar cells.

42. The apparatus of claim 30, further comprising a heating element, wherein the processor executable instructions, when executed by the one or more processors, further cause the apparatus to transfer power from a power source of the plurality of power sources to the load for a first phase of the multiphase cycle and to transfer power from the load to the heating element for a second phase of the multiphase cycle.

* * * * *